US008117983B2

(12) United States Patent
Fork et al.

(10) Patent No.: US 8,117,983 B2
(45) Date of Patent: Feb. 21, 2012

(54) DIRECTIONAL EXTRUDED BEAD CONTROL

(75) Inventors: David K. Fork, Los Altos, CA (US); Scott E. Solberg, Mountain View, CA (US)

(73) Assignee: Solarworld Innovations GmbH, Freiberg (DE)

( * ) Notice: Subject to any disclaimer, the term of this patent is extended or adjusted under 35 U.S.C. 154(b) by 519 days.

(21) Appl. No.: 12/267,069

(22) Filed: Nov. 7, 2008

(65) Prior Publication Data
US 2010/0116199 A1    May 13, 2010

(51) Int. Cl.
*B05C 3/02* (2006.01)
(52) U.S. Cl. .................................... 118/410; 425/133.5
(58) Field of Classification Search .......... 118/410–419, 118/320; 438/780–782; 427/115, 240, 286, 427/230, 235, 273; 425/133.5, 131.1, 192 R, 425/376.1, 461–464
See application file for complete search history.

(56) References Cited

U.S. PATENT DOCUMENTS

| 2,031,387 | A | 2/1936 | Schwarz |
| 2,326,803 | A | 8/1943 | Samiran |
| 2,761,791 | A | 9/1956 | Russell |
| 2,789,731 | A | 4/1957 | Marraffino |
| 3,032,008 | A | 5/1962 | Land et al. |
| 3,159,313 | A | 12/1964 | Guilford |
| 3,602,193 | A | 8/1971 | Adams et al. |
| 3,973,994 | A | 8/1976 | Redfield |
| 3,988,166 | A | 10/1976 | Beam |
| 4,018,367 | A | 4/1977 | Morine et al. |
| 4,021,267 | A | 5/1977 | Dettling |
| 4,045,246 | A | 8/1977 | Mlavsky et al. |
| 4,053,327 | A | 10/1977 | Meulenberg, Jr. |
| 4,084,985 | A | 4/1978 | Evans, Jr. |
| 4,086,485 | A | 4/1978 | Kaplow et al. |
| 4,095,997 | A | 6/1978 | Griffiths |
| 4,119,058 | A | 10/1978 | Schmermund |
| 4,131,485 | A | 12/1978 | Meinel et al. |
| 4,141,231 | A | 2/1979 | Kudlich |
| 4,148,301 | A | 4/1979 | Cluff |
| 4,153,476 | A | 5/1979 | Shelpuk |
| 4,177,083 | A | 12/1979 | Kennedy |

(Continued)

FOREIGN PATENT DOCUMENTS

CN         2606309 Y       3/2004

(Continued)

OTHER PUBLICATIONS

Szlufcik et al. "Low-Cost Industrial Technologies of Crystalline Silicon Solar Cells", Proc. of the IEEE, vol. 85, No. 5, May 1, 1997, pp. 711-730.

(Continued)

*Primary Examiner* — Yewebdar Tadesse

(57) ABSTRACT

A micro-extrusion printhead assembly utilized in a micro-extrusion system to form parallel extruded lines of material on a substrate includes a material feed system for pushing/drawing materials out of extrusion nozzles defined in the printhead assembly, a Z-axis positioning mechanism, and a base. The micro-extrusion printhead includes a layered nozzle structure sandwiched between back and front plate structures. The layered nozzle structure includes stacked plates including top and bottom nozzle plates sandwiching a nozzle outlet plate. According to various embodiments, at least one of the nozzle structure materials of the printhead assembly, the output geometry of the printhead assembly, and the internal conduit geometry of the printhead assembly are modified to cause the bead traveling through the extrusion nozzle to be reliably directed (biased) toward the target substrate as it leaves the printhead nozzle orifice.

2 Claims, 12 Drawing Sheets

U.S. PATENT DOCUMENTS

| | | |
|---|---|---|
| 4,221,468 A | 9/1980 | Macken |
| 4,224,081 A | 9/1980 | Kawamura et al. |
| 4,254,894 A | 3/1981 | Fetters |
| 4,331,703 A | 5/1982 | Lindmayer |
| 4,337,758 A | 7/1982 | Meinel et al. |
| 4,355,196 A | 10/1982 | Chai |
| 4,420,510 A | 12/1983 | Kunkel et al. |
| 4,461,403 A | 7/1984 | Prahs |
| 4,476,165 A | 10/1984 | McIntyre |
| 4,490,418 A | 12/1984 | Yoshida |
| 4,521,457 A | 6/1985 | Russell et al. |
| 4,540,843 A | 9/1985 | Gochermann et al. |
| 4,602,120 A | 7/1986 | Wakefield et al. |
| 4,683,348 A | 7/1987 | Pidgeon et al. |
| 4,746,370 A | 5/1988 | Woolf |
| 4,747,517 A | 5/1988 | Hart |
| 4,792,685 A | 12/1988 | Yamakawa |
| 4,796,038 A | 1/1989 | Allen et al. |
| 4,826,777 A | 5/1989 | Ondris |
| 4,841,946 A | 6/1989 | Marks |
| 4,847,349 A | 7/1989 | Ohta et al. |
| 4,849,028 A | 7/1989 | Krause |
| 4,855,884 A | 8/1989 | Richardson |
| 4,938,994 A | 7/1990 | Choinski |
| 4,947,825 A | 8/1990 | Moriarty |
| 4,952,026 A | 8/1990 | Bellman et al. |
| 4,985,715 A | 1/1991 | Cyphert et al. |
| 5,000,988 A | 3/1991 | Inoue et al. |
| 5,004,319 A | 4/1991 | Smither |
| 5,011,565 A | 4/1991 | Dube et al. |
| 5,062,899 A | 11/1991 | Kruer |
| 5,075,281 A | 12/1991 | Testardi |
| 5,089,055 A | 2/1992 | Nakamura |
| 5,120,484 A | 6/1992 | Cloeren |
| 5,151,377 A | 9/1992 | Hanoka et al. |
| 5,167,724 A | 12/1992 | Chiang |
| 5,180,441 A | 1/1993 | Cornwall et al. |
| 5,188,789 A | 2/1993 | Nishiura |
| 5,213,628 A | 5/1993 | Noguchi et al. |
| 5,216,543 A | 6/1993 | Calhoun |
| 5,254,388 A | 10/1993 | Melby et al. |
| 5,344,496 A | 9/1994 | Stern et al. |
| 5,353,813 A | 10/1994 | Deevi et al. |
| 5,356,488 A | 10/1994 | Hezel |
| 5,389,159 A | 2/1995 | Kataoka et al. |
| 5,449,413 A | 9/1995 | Beauchamp et al. |
| 5,501,743 A | 3/1996 | Cherney |
| 5,529,054 A | 6/1996 | Shoen |
| 5,536,313 A | 7/1996 | Watanabe et al. |
| 5,538,563 A | 7/1996 | Finkl |
| 5,540,216 A | 7/1996 | Rasmusson |
| 5,543,333 A | 8/1996 | Holdermann |
| 5,552,820 A | 9/1996 | Genovese |
| 5,559,677 A | 9/1996 | Errichiello |
| 5,560,518 A | 10/1996 | Catterall et al. |
| 5,569,399 A | 10/1996 | Penney et al. |
| 5,590,818 A | 1/1997 | Raba et al. |
| 5,605,720 A | 2/1997 | Allen et al. |
| 5,665,175 A | 9/1997 | Safir |
| 5,679,379 A | 10/1997 | Fabricante et al. |
| 5,700,325 A | 12/1997 | Watanabe |
| 5,733,608 A | 3/1998 | Kessel et al. |
| 5,873,495 A | 2/1999 | Saint-Germain |
| 5,918,771 A | 7/1999 | van der Heijden |
| 5,929,530 A | 7/1999 | Stone |
| 5,949,123 A | 9/1999 | Le et al. |
| 5,981,902 A | 11/1999 | Arita et al. |
| 5,990,413 A | 11/1999 | Ortabasi |
| 6,011,307 A | 1/2000 | Jiang et al. |
| 6,020,554 A | 2/2000 | Kaminar et al. |
| 6,032,997 A | 3/2000 | Elliott et al. |
| 6,047,862 A | 4/2000 | Davies |
| 6,091,017 A | 7/2000 | Stern |
| 6,118,067 A | 9/2000 | Lashley et al. |
| 6,130,465 A | 10/2000 | Cole |
| 6,140,570 A | 10/2000 | Kariya |
| 6,164,633 A | 12/2000 | Mulligan et al. |
| 6,203,621 B1 | 3/2001 | Tran et al. |
| 6,232,217 B1 | 5/2001 | Ang et al. |
| 6,257,450 B1 | 7/2001 | Jackson et al. |
| 6,274,508 B1 | 8/2001 | Jacobsen et al. |
| 6,278,054 B1 | 8/2001 | Ho et al. |
| 6,293,498 B1 | 9/2001 | Stanko et al. |
| 6,310,281 B1 | 10/2001 | Wendt et al. |
| 6,323,415 B1 | 11/2001 | Uematsu et al. |
| RE37,512 E | 1/2002 | Szlufcik et al. |
| 6,351,098 B1 | 2/2002 | Kaneko |
| 6,354,791 B1 | 3/2002 | Wytman et al. |
| 6,375,311 B1 | 4/2002 | Kuramoto |
| 6,379,521 B1 | 4/2002 | Nishio |
| 6,398,370 B1 | 6/2002 | Chiu et al. |
| 6,407,329 B1 | 6/2002 | Iino et al. |
| 6,410,843 B1 | 6/2002 | Kishi et al. |
| 6,418,986 B1 | 7/2002 | Gabriele |
| 6,420,266 B1 | 7/2002 | Smith et al. |
| 6,423,140 B1 | 7/2002 | Liu et al. |
| 6,429,037 B1 | 8/2002 | Wenham et al. |
| 6,479,395 B1 | 11/2002 | Smith et al. |
| 6,527,964 B1 | 3/2003 | Smith et al. |
| 6,529,220 B1 | 3/2003 | Matsumoto |
| 6,531,653 B1 | 3/2003 | Glenn et al. |
| 6,555,739 B2 | 4/2003 | Kawam |
| 6,558,146 B1 | 5/2003 | Shah et al. |
| 6,568,863 B2 | 5/2003 | Murata |
| 6,590,235 B2 | 7/2003 | Carey et al. |
| 6,597,510 B2 | 7/2003 | Bunkenburg et al. |
| 6,623,579 B1 | 9/2003 | Smith et al. |
| 6,663,944 B2 | 12/2003 | Park et al. |
| 6,666,165 B2 | 12/2003 | Shiraishi et al. |
| 6,667,434 B2 | 12/2003 | Morizane et al. |
| 6,743,478 B1 | 6/2004 | Kiiha et al. |
| 6,890,167 B1 | 5/2005 | Kwok et al. |
| 6,896,381 B2 | 5/2005 | Benitez et al. |
| 6,924,493 B1 | 8/2005 | Leung |
| 7,045,794 B1 | 5/2006 | Spallas et al. |
| 7,101,592 B2 | 9/2006 | Gueggi et al. |
| 7,152,985 B2 | 12/2006 | Benitez et al. |
| 7,160,522 B2 | 1/2007 | Dominguez et al. |
| 7,181,378 B2 | 2/2007 | Benitez et al. |
| 7,388,147 B2 | 6/2008 | Mulligan et al. |
| 7,394,016 B2 | 7/2008 | Gronet |
| 2001/0001746 A1* | 5/2001 | Chun et al. .................. 438/780 |
| 2001/0008230 A1 | 7/2001 | Keicher et al. |
| 2001/0053420 A1 | 12/2001 | Donges et al. |
| 2002/0056473 A1 | 5/2002 | Chandra et al. |
| 2002/0060208 A1 | 5/2002 | Liu et al. |
| 2002/0083895 A1 | 7/2002 | Nakamura et al. |
| 2002/0148497 A1 | 10/2002 | Sasaoka et al. |
| 2002/0149107 A1 | 10/2002 | Chang et al. |
| 2002/0154396 A1 | 10/2002 | Overbeck |
| 2003/0015820 A1 | 1/2003 | Yamazaki et al. |
| 2003/0095175 A1 | 5/2003 | Agorio |
| 2003/0129810 A1 | 7/2003 | Barth et al. |
| 2003/0201581 A1 | 10/2003 | Weber et al. |
| 2003/0232174 A1 | 12/2003 | Chang et al. |
| 2004/0012676 A1 | 1/2004 | Weiner |
| 2004/0031517 A1 | 2/2004 | Bareis |
| 2004/0048001 A1 | 3/2004 | Kiguchi et al. |
| 2004/0070855 A1 | 4/2004 | Benitez et al. |
| 2004/0084077 A1 | 5/2004 | Aylaian |
| 2004/0151014 A1 | 8/2004 | Speakman |
| 2004/0191422 A1 | 9/2004 | Kataoka |
| 2004/0200520 A1 | 10/2004 | Mulligan et al. |
| 2004/0211460 A1 | 10/2004 | Simburger et al. |
| 2004/0259382 A1 | 12/2004 | Nishimura et al. |
| 2004/0265407 A1 | 12/2004 | Prugh et al. |
| 2005/0000566 A1 | 1/2005 | Posthuma et al. |
| 2005/0029236 A1 | 2/2005 | Gambino et al. |
| 2005/0034751 A1 | 2/2005 | Gross et al. |
| 2005/0046977 A1 | 3/2005 | Shifman |
| 2005/0067729 A1 | 3/2005 | Laver et al. |
| 2005/0081908 A1 | 4/2005 | Stewart |
| 2005/0133084 A1 | 6/2005 | Joge et al. |
| 2005/0194037 A1 | 9/2005 | Asai |
| 2005/0221613 A1 | 10/2005 | Ozaki et al. |
| 2005/0253308 A1 | 11/2005 | Sherwood |
| 2006/0207650 A1 | 9/2006 | Winston et al. |

| | | | |
|---|---|---|---|
| 2006/0231133 A1 | 10/2006 | Fork et al. | |
| 2006/0251796 A1 | 11/2006 | Fellingham | |
| 2006/0266235 A1 | 11/2006 | Sandhu et al. | |
| 2007/0108229 A1 | 5/2007 | Fork et al. | |
| 2007/0110836 A1* | 5/2007 | Fork et al. | 425/133.5 |
| 2007/0231478 A1* | 10/2007 | Watanabe et al. | 427/162 |
| 2008/0047605 A1 | 2/2008 | Benitez et al. | |
| 2008/0138456 A1 | 6/2008 | Fork et al. | |

FOREIGN PATENT DOCUMENTS

| | | |
|---|---|---|
| CN | 1854637 A | 11/2006 |
| DE | 197 35 281 A1 | 2/1999 |
| EP | 0 257 157 A | 3/1988 |
| EP | 0 851 511 A | 7/1998 |
| EP | 1 145 797 A | 10/2001 |
| EP | 1 351 318 A | 10/2003 |
| EP | 1 715 260 A | 10/2006 |
| EP | 1 763 086 A | 3/2007 |
| EP | 1 787 786 A | 5/2007 |
| EP | 1 833 099 A | 9/2007 |
| JP | 60082680 A | 5/1985 |
| JP | 02 187291 A | 7/1990 |
| JP | 05-031786 A | 2/1993 |
| JP | 2002-111035 A | 4/2002 |
| JP | 2004-266023 A | 9/2004 |
| JP | 2005051216 | 2/2005 |
| WO | WO 91/08503 A | 6/1991 |
| WO | WO 91/15355 | 10/1991 |
| WO | WO 92/15845 A | 9/1992 |
| WO | WO 94/28361 A1 | 12/1994 |
| WO | WO 97/21253 A | 6/1997 |
| WO | WO 97/48519 A | 12/1997 |
| WO | WO 00/49421 A1 | 8/2000 |
| WO | WO 00/49658 A1 | 8/2000 |
| WO | WO 00/50215 | 8/2000 |
| WO | WO 02/052250 A | 7/2002 |
| WO | WO 02/097724 A1 | 12/2002 |
| WO | WO 03/047005 A | 6/2003 |
| WO | WO 03/076701 A | 9/2003 |
| WO | WO 2005/070224 A1 | 8/2005 |
| WO | WO 2005/107957 A1 | 11/2005 |
| WO | WO 2005/107958 A1 | 11/2005 |
| WO | WO 2006/097303 A | 9/2006 |
| WO | WO 2007/104028 | 9/2007 |

OTHER PUBLICATIONS

Ruthe et al. "Etching of CuInSe$_2$ Thin Films-Comparison of Femtosecond and Picosecond Laser Ablation", Applied Surface Science, vol. 247, No. 1-4, Jul. 15, 2005, pp. 447-452.

Sparber et al. "Comparison of texturing methods for monocrystalline silicon solar cells using KOH and Na$_2$CO$_3$," 3$^{rd}$ World Conf. Photovoltaic Energy Conversion, Osaka, 2003, pp. 1372-1375.

MacDonald et al. "Texturing industrial multicrystalline silicon solar cells," Solar Energy, vol. 76, 2004, pp. 277-283.

Tool et al. "Straightforward in-line processing for 16.8% efficient mc-Si solar cells," 31$^{st}$ IEEE Photovoltaic Specialists Conf., Florida, 2005, pp. 1324-1327.

Fukui et al. "17.7% efficiency large area multicrystalline silicon solar cell using screen-printed metallization technique," 31$^{st}$ IEEE Photovoltaic Specialists Conf., Florida, 2005, pp. 979-982.

Mitsubishi Electric Corp., Mitsubishi Electric Develops Practical-Use Multi-Crystalline Silicon Solar Cell with World's Highest Conversion Efficiency Rate of 18.6%, News Release #2432, Tokyo, Mar. 19, 2008, Available URL: http://global.mitsubishielectric.com/news/news_releases/2008/me10705.pdf.

Zhao et al. "19.8% efficient 'honeycomb' textured multicrystalline and 24.4% monocrystalline silicon solar cells," Applied Physics Letters, vol. 73, pp. 1991-1993, 1998.

Abbott et al. "Optical and Electrical Properties of Laser Texturing for High-efficiency Solar Cells," Progress in Photovoltaics: Research and Applications, Published online Jan. 5, 2006, vol. 14, pp. 225-235, 2006.

Brogren et al. "Optical properties, durability, and system aspects of a new aluminum-polymer-laminated steel reflector for solar concentrators", Jan. 2004, Solar Energy Materials and Solar Cells, 82, pp. 387-412.

Mauk et al. "Buried Metal/Dielectric/Semiconductor Reflectors for Light Trapping in Epitaxial Thin-Film Solar Cells", May 1996, IEEE, 25th PVSC, pp. 147-150.

Munzer et al. "Thin Monocrystalline Silicon Solar Cells", Oct. 1999, IEEE Transactions on Electron Devices, vol. 46, No. 10, pp. 2055-2061.

Knight et al. "Hydrodynamic Focusing on a Silicon Chip: Mixing Nanoliters in Microseconds", Physical Review Letters, vol. 80, No. 17, Apr. 27, 1998, pp. 3863-3866.

Raabe et al. "High Aspect Ratio Screen Printed Fingers", 20th European Solar Energy Conference and Exhibition, Barcelona, Spain, Jun. 6-10, 2005, 4 pgs.

"Annual Review of Numerical Fluid Mechanics and Heat Transfer", vol. 1, Ed. T. C. Chawla, "Chapter Five, Buckling Flows: A New Frontier in Fluid Mechanics", A. Bejan, Hemisphere Publishing Corporation, 1987, pp. 262-304.

Liang et al. "Co-Extrusion of Solid Oxide Fuel Cell Functional Elements", Ceramic Engineering and Science Proceedings, vol. 20, No. 4, 1999, pp. 587-594.

Shannon et al. "The Production of Alumina/Zirconia Laminated Composites by Co-Extrusion", Ceramic Engineering and Science Proceedings, vol. 16, No. 5, 1955, pp. 1115-1120.

Kenis et al. "Microfabrication Inside Capillaries Using Multiphase Laminar Flow Patterning", Science, vol. 285, Jul. 2, 1999, pp. 83-85.

Nijs et al. "Overview of solar cell technologies and results on high efficiency multicrystalline silicon substrates," Solar Energy Materials and Solar Cells, vol. 48, No. 1-4, Nov. 1, 1997, pp. 199-217.

U.S. Appl. No. 11/282,882, filed Nov. 17, 2005, Fork et al.

U.S. Appl. No. 11/282,829, filed Nov. 17, 2005, Fork et al.

U.S. Appl. No. 11/336,714, filed Jan. 20, 2006, Fork et al.

Alvarez et al. "RXI Concentrator for 1000X Photovoltaic Energy Conversion," Proc. SPIE, vol. 3781, 30 (1999), 9 pages.

Benitez et al. "High-Concentration Mirror-Based Kohler Integrating System for Tandem Solar Cells", WCPEC2006, 4 pages.

Bett et al. "FLATCON™ and FLASHCON™ Concepts for High Concentration PV", Presented at the 19$^{th}$ European Photovoltaic Solar Energy Conf., Jun. 7-11, 2004, Paris, 4 pages.

Cousins et al. "Manufacturing and Design Issues for Thin Silicon Solar Cells Manufactured on FZ(B), MCZ(B), CZ(Ga) and CZ(B) Wafers", IEEE, pp. 987-990, 2005.

Cuevas et al. "50 Per Cent More Output Power from an Albedo-Collecting Flat Panel Using Bifacial Solar Cells", *Solar Energy*, vol. 29, No. 5, pp. 419-420, 1982.

Finlayson et al. "Bi$_2$O$_3$-Wo$_3$ compounds for photocatalytic applications by solid state and viscous processing", Title from a conference scheduled for Oct. 6-7, 2004 in Munich, 8 pages.

Gordon et al. "Optical performance at the thermodynamic limit with tailored imaging designs", Applied Optics, in press, Dec. 2004, 16 pages.

Kenis et al. "Fabrication inside Microchannels Using Fluid Flow", Accounts of Chemical Research, vol. 33, No. 12, 2000, pp. 841-847.

Kerschaver et al. "Back-contact Solar Cells: A Review," Progress in Photovoltaics: Research and Applications, 2006, vol. 14, pp. 107-123.

Kränzl et al. "Bifacial Solar Cells on Multi-Crystalline Silicon", 15$^{th}$ International Photovoltaic Science & Engineering Conference, Shanghai, China, 2 pages, 2005.

Mueller et al. "Breathable Polymer Films Produced by the Microlayer Coextrusion Process", Journal of Applied Polymer Science, vol. 78, pp. 816-828, 2000.

Mulligan et al. "A Flat-Plate Concentrator: Micro-Concentrator Design Overview", 2000 IEEE, pp. 1495-1497.

Mulligan et al. "Development of Chip-Size Silicon Solar Cells," IEEE Photovoltaic Specialists Conference, 2000, pp. 158-163.

Neuhaus et al. "Industrial Silicon Wafer Solar Cells," Advances in OptoElectronics, vol. 2007, 2007, 15 pages.

Nguyen, Luu "Wafer Level Packaging for Analog/Mixed Signal Applications", MEPTEC Int. Wafer Level Packaging Conference, Aug. 22, 2002, 41 pages.

Rao et al. "Microfabricated Deposition Nozzles for Direct-Write Assembly of Three-Dimensional Periodic Structures", *Advanced Materials*, vol. 17, No. 3, Feb. 10, 2005, 5 pages.

Recart et al. "Large Area Thin BSF Solar Cells With Simultaneously Diffused Boron and Phosphorus Screen Printed Emitters", IEEE, pp. 1213-1216, 2005.

Sun et al. "Modeling and Experimental Evaluation of Passive Heat Sinks for Miniature High-Flux Photovoltaic Concentrators", Transactions of the ASME, vol. 127, pp. 138-145 (2005).

Sundararajan et al. "Three-Dimensional Hydrodynamic Focusing in Polydimethylsiloxane (PDMS) Microchannels", Journal of Microelectromechanical Systems, vol. 13, No. 4, Aug. 2004, pp. 559-567.

Swanson, Richard M. "The Promise of Concentrators", *Prog. Photovolt. Res. Appl.* 8, pp. 93-111 (2000).

Taguchi et al. An Approach for the Higher Efficiency in the HIT Cells, IEEE, pp. 866-871, 2005.

Terao et al. "A Mirror-Less Design for Micro-Concentrator Modules", Conference Record of the $28^{th}$ IEEE Photovoltaic Specialists Conference (2000) pp. 1416-1419.

Terao, Akira "MicroDish: A Novel Reflective Optic for Flat-Plate Micro-Concentrator", SPIE's $49^{th}$ Annual Meeting, Aug. 2-6, 2004, Denver, Colorado, USA, 9 pages.

Van Hoy et al. "Microfabrication of Ceramics by Co-extrusion", *J. Am. Ceram. Soc.*, vol. 81, No. 1, pp. 152-158, 1998.

Weber et al. "Modelling of Sliver® Modules Incorporating a Lambertian Rear Reflector", The Australian National University, Canberra ACT 0200, Australia, 4 pages, 2005.

Gimac Compact Triplex TR12 Micro-Coextrusion Plant, NPE 2000, Jun. 19-23, 2000, McCormick Place, Chicago, Il, Booth 13154, http://www.citsco.com/NPE2000/npepage1.html, 2 pages.

Extrusion/Coextrusion Dies, Extrusion Dies Industries, LLC, http://www.extrusiondies.com/PRODUCTS/ExtrusionDies/multimanifoldDies.htmL, 1 page.

Hitachi: Offering Total Environmental Solutions, Environmental Activities, http://greenweb.hitachi.co.jp/en/sustainable/total-solution.html, 5 pages, 2003.

Sanyo Solar Panels, Sanyo HIT Solar Panel Discount—Solar Electric Supply, Sanyo Solar Modules, http://www.solarelectricsupply.com/Solar_Panels/Sanyo/sanyo.html, 4 pages, 2005.

SunPower Corp. News Release, May 12, 2008, Available URL: http://investors.sunpowercorp.com/releasedetail.cfm?ReleaseID=309613.

Schweizer, Peter M. "Curtain Coating Technology Can Mean Big Benefits," Paper, Film & Foil Converter website, Mar. 1, 2000, 5 pages, http://pffc-online.com/mag/paper_curtain_coating_technology/.

* cited by examiner

DIRECTIONAL EXTRUDED BEAD CONTROL

FIELD OF THE INVENTION

The present invention is related to extrusion systems, and more particularly to micro-extrusion systems for extruding closely spaced lines of functional material on a substrate.

BACKGROUND

Co-extrusion is useful for many applications, including inter-digitated pn junction lines, conductive gridlines for solar cells, electrodes for electrochemical devices, etc.

In order to meet the demand for low cost large-area semiconductors, micro-extrusion methods have been developed that include extruding a dopant bearing material (dopant ink) along with a sacrificial material (non-doping ink) onto the surface of a semiconductor substrate, and then heating the semiconductor substrate such that the dopant disposed in the dopant ink diffuses into the substrate to form the desired doped region or regions. In comparison to screen printing techniques, the extrusion of dopant material on the substrate provides superior control of the feature resolution of the doped regions, and facilitates deposition without contacting the substrate, thereby avoiding wafer breakage. Such fabrication techniques are disclosed, for example, in U.S. Patent Application No. 20080138456, which is incorporated herein by reference in its entirety.

In extrusion printing of lines of functional material (e.g., dopant ink or metal gridline material) on a substrate, it is necessary to control where the bead of dispensed material (e.g., dopant ink) goes once it leaves the printhead nozzle. Elastic instabilities, surface effects, substrate interactions and a variety of other influences can cause the bead to go in many undesired directions. The problem is usually solved by running the deposition (printhead) nozzles very close to the substrate so that the bead sticks to the substrate before it can wander off. Unfortunately, this causes the printhead to get contaminated with ink, and in a high speed (>100 mm/sec) production deposition apparatus with print heads containing dozens of nozzles and substrates with considerable thickness variation (>50 microns), it is not practical to print in close proximity.

What is needed is a micro extrusion printhead and associated apparatus for forming extruded material beads at a low cost that is acceptable to the solar cell industry and addresses the problems described above. In particular, what is needed is a printhead assembly that includes a mechanism for controlling the direction of the extruded bead so that it is biased downward onto the substrate, and away from the printhead.

SUMMARY OF THE INVENTION

The present invention is generally directed to a micro-extrusion printhead assembly utilized in a micro-extrusion system to form parallel extruded lines of functional material on a substrate surface. The micro-extrusion system includes a material feed system for pushing/drawing (extruding) materials out of extrusion nozzles defined in the printhead assembly, an X-Y-Z-axis positioning mechanism for positioning the printhead assembly relative to the substrate, and a base for supporting the substrate under the printhead assembly during the extrusion process. The present invention is particularly directed to modifications of the micro-extrusion printhead assembly that reliably bias the bead toward the substrate during extrusion, thereby improving print quality by causing early attachment of the extruded bead to the substrate. By biasing the bead toward the substrate, the bead is caused to reliably strike the substrate immediately after it leaves the printhead nozzle, so the print process is less likely to become unstable because of bunching or oscillatory behaviors, and fouling of the printhead is avoided. Further, because the bead is reliably directed toward the substrate, it is possible to position the printhead assembly at a larger working distance from the substrate and with looser mechanical tolerances on the printhead height (i.e., the distance separating the printhead from the substrate), which is critical for high speed production operation. The bead of material may, upon subsequent processing, form a variety of useful structures for solar cell fabrication including but not limited to solar cell gridlines, solar cell bus bars, the back surface field metallization of a solar cell, and doped regions of the semiconductor junction.

According to an aspect of the present invention, the micro-extrusion printhead includes a layered nozzle structure sandwiched between a first (back) plate structure and a second (front) plate structure. The layered nozzle structure is made up of stacked metal (or other rigid material) plates including a top nozzle plate, an optional bottom nozzle plate, and a nozzle outlet plate sandwiched between the top and bottom nozzle plates (or between the top nozzle plate and the second plate structure). Each nozzle is formed by an elongated nozzle channel that is etched or otherwise formed in the nozzle outlet plate, and portions of the top and bottom nozzle plates that serve as upper and lower walls of the extrusion nozzle. The upper and lower plate structures serve to guide the extrusion material from an inlet port to the layered nozzle structure, and to rigidly support the layered nozzle structure such that the extrusion nozzles are pointed toward the substrate at a predetermined angle (i.e., such that extruded material traveling down the extrusion nozzle toward the nozzle orifice is directed toward the targeted substrate). In principle, it is possible to point the nozzle channel directly at the substrate, at a 90° angle relative to the substrate surface; however, this approach has the undesired effect of causing the bead to make a sharp turn that can induce undesirable shape changes in the deposited line. In a preferred embodiment, the extrusion nozzle is maintained at a tilted angle, such as 45°, whereby the extruded material is directed toward the substrate so that it adheres quickly to the substrate without fouling the printhead. That is, in one embodiment, the extrusion material passes from a bore/conduit formed in the upper plate structure through an inlet port defined in the top nozzle plate, and into a closed end of the elongated nozzle channel of and a nozzle orifice. Once inside the extrusion nozzle, the extrusion material is directed in a first direction along (or parallel to) a lateral extrusion plane defined by the nozzle outlet plate, and through the outlet orifice (i.e., the open end of the nozzle channel), which is defined in a front edge of the layered nozzle structure. Because the extruded material is guided along the extrusion plane at the tilted angle as it exits the nozzle orifice, the layered micro-extrusion printhead reliably directs the extruded material toward the substrate in a manner that facilitates high volume solar panel production.

According to the present invention, at least one of the nozzle structure materials of the printhead assembly, the output geometry of the printhead assembly, and the internal conduit geometry of the printhead assembly are modified to cause the bead traveling through the extrusion nozzle (i.e., in or parallel to the lateral extrusion plane) to be reliably directed (angled) toward the target substrate as it leaves the printhead nozzle orifice. In particular, at least one of the top nozzle plate, the bottom nozzle plate (when used), and the nozzle outlet plate of the layered nozzle structure is modified such that the bead is biased toward the target substrate as it exits the extrusion nozzle (i.e., the bead is directed in or downward from the lateral extrusion plane).

According to a first embodiment of the invention, dissimilar materials are utilized to form the top and bottom nozzle plates, where the dissimilar materials are selected so as to influence the direction with which the bead exits the printhead. For example, when the top nozzle plate is composed of Cirlex™ and nozzle outlet and bottom nozzle plates are composed of Kapton™, the bead tends to bend upward and forms an undesirable blob of ink on the printhead. Since in this case both materials are forms of polyimide, it is believed that the preferred direction for the ink bead may be influenced by the passageways inside the printhead, upstream of the nozzles. An alternative explanation is that there is a sufficient difference in the surface properties, due to different manufacturing processes, between the thicker Cirlex™ and thinner Kapton™ layers to create a difference in the affinity of the ink for the materials, even though they are both polyimides. In one embodiment, the top nozzle plate is formed using a first material (e.g., Cirlex™) having a lesser affinity for the ink/paste than that of than that of a second material (e.g., stainless steel) used to form the nozzle outlet plate and/or the bottom nozzle plate. For example, when the top nozzle plate is composed of Cirlex™, the nozzle outlet plate is composed of Kapton™, and the bottom nozzle plate is composed of stainless steel, the tendency of the ink to curl upwards away from the substrate is reduced.

According to a second embodiment of the invention, the output (i.e., nozzle outlet) geometry of the printhead assembly is modified in a way that reduces the tendency of the ink stream to curl upwards away from the substrate. This biasing mechanism is achieved, for example, by forming the printhead assembly such that the upper wall of each nozzle extends a predetermined distance farther along the extrusion plane in the downstream direction of the extruded bead (i.e., closer to the substrate) than the lower wall of the nozzle, which has the effect of forcing the extruded material down and away from printhead assembly as it exits nozzle orifice. In one specific embodiment, this geometry is achieved by mounting the top nozzle plate and the bottom nozzle plate on the nozzle outlet plate such that the second front edge of the nozzle outlet plate and the third front edge of the bottom nozzle plate are coplanar and define a front edge of printhead assembly, and such that the first front edge of the top nozzle plate protrudes the predetermined distance farther in the downstream direction from the front edge of printhead assembly. In another specific embodiment, the desired geometry is achieved by mounting the bottom nozzle plate such that the third front edge of the bottom nozzle plate is recessed by the predetermined distance from a printhead assembly front edge defined by the second front edge of the nozzle outlet plate and the first front edge of the top nozzle plate. In yet another specific embodiment, the printhead assembly is formed such that a bottom bevel surface (which is maintained parallel to the substrate during wafer operation) bisects the bottom nozzle plate and the nozzle outlet plate, whereby the nozzle outlet is defined in the bottom chamfer such that the "upper" edge of the nozzle outlet is downstream of the "lower" edge (i.e., such that the second front edge of the nozzle outlet plate and the third front edge of the bottom nozzle plate define a coplanar printhead assembly front edge that is parallel to the upper surface). An advantage of forming the nozzle outlet in the chamfer is that the surface of the printhead remains planar, making it easier to clean in comparison to the protruding/recessed plate embodiments mentioned above.

According to another embodiment of the present invention, the associated micro-extrusion system includes a co-extrusion printhead assembly that is constructed to co-extrude two different materials in order to form closely spaced high-aspect ratio gridline structures on a substrate surface or narrow printed lines of dopant bearing paste. Similar to the single material extrusion embodiments described above, the co-extrusion printhead assembly includes upper an lower plate structures that serve to guide the two extrusion materials via separate conduits from corresponding inlet ports to a layered nozzle structure, and a layered nozzle structure that is formed in accordance with the various specific embodiments described above to bias the extruded bead toward the target substrate. However, in the co-extrusion embodiment, the extruded bead includes a sacrificial material and a gridline (functional) material arranged such that the gridline material forms a high-aspect ratio gridline structure that is supported between two sacrificial material portions (the sacrificial portions are subsequently removed). The formation of such co-extruded bead structures requires the compression of the gridline material between the two sacrificial material portions, which is achieved by utilizing a three-part nozzle channel including a central channel and two side channels that converge with the central channel at a merge point located adjacent to the nozzle orifice (opening). The gridline material is transferred through the central nozzle channel, and the sacrificial material is transferred through the two side channels such that the gridline material is compressed between the two sacrificial material portions at the merge point, and is forced through the nozzle orifice (opening) to form a high-aspect ratio gridline structure (bead) that is supported between the two sacrificial material portions. In accordance with a specific embodiment of the present invention, the three converging channels of each three-part nozzle channel comprise troughs defined (e.g., etched into but not through) the plate material forming the nozzle outlet plate, whereby each nozzle is defined only by the plate material of the nozzle outlet plate that is etched to form each three-part nozzle channel, and a bottom nozzle plate that is disposed over the open surface of each three-part nozzle channel. In addition, the nozzle outlet orifice includes a converging/diverging structure in which a relatively narrow section is located between the merge point and a relatively wide outlet orifice 169F in order to lower the pressure drop in a printhead.

BRIEF DESCRIPTION OF THE DRAWINGS

These and other features, aspects and advantages of the present invention will become better understood with regard to the following description, appended claims, and accompanying drawings, where:

DETAILED DESCRIPTION

The present invention relates to an improvement in micro-extrusion systems. The following description is presented to enable one of ordinary skill in the art to make and use the invention as provided in the context of a particular application and its requirements. As used herein, directional terms such as "upper", "top", "lower", "bottom", "front", "rear", and "lateral" are intended to provide relative positions for purposes of description, and are not intended to designate an absolute frame of reference. In addition, the phrases "integrally connected" and "integrally molded" is used herein to describe the connective relationship between two portions of a single molded or machined structure, and are distinguished from the terms "connected" or "coupled" (without the modifier "integrally"), which indicates two separate structures that are joined by way of, for example, adhesive, fastener, clip, or movable joint. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
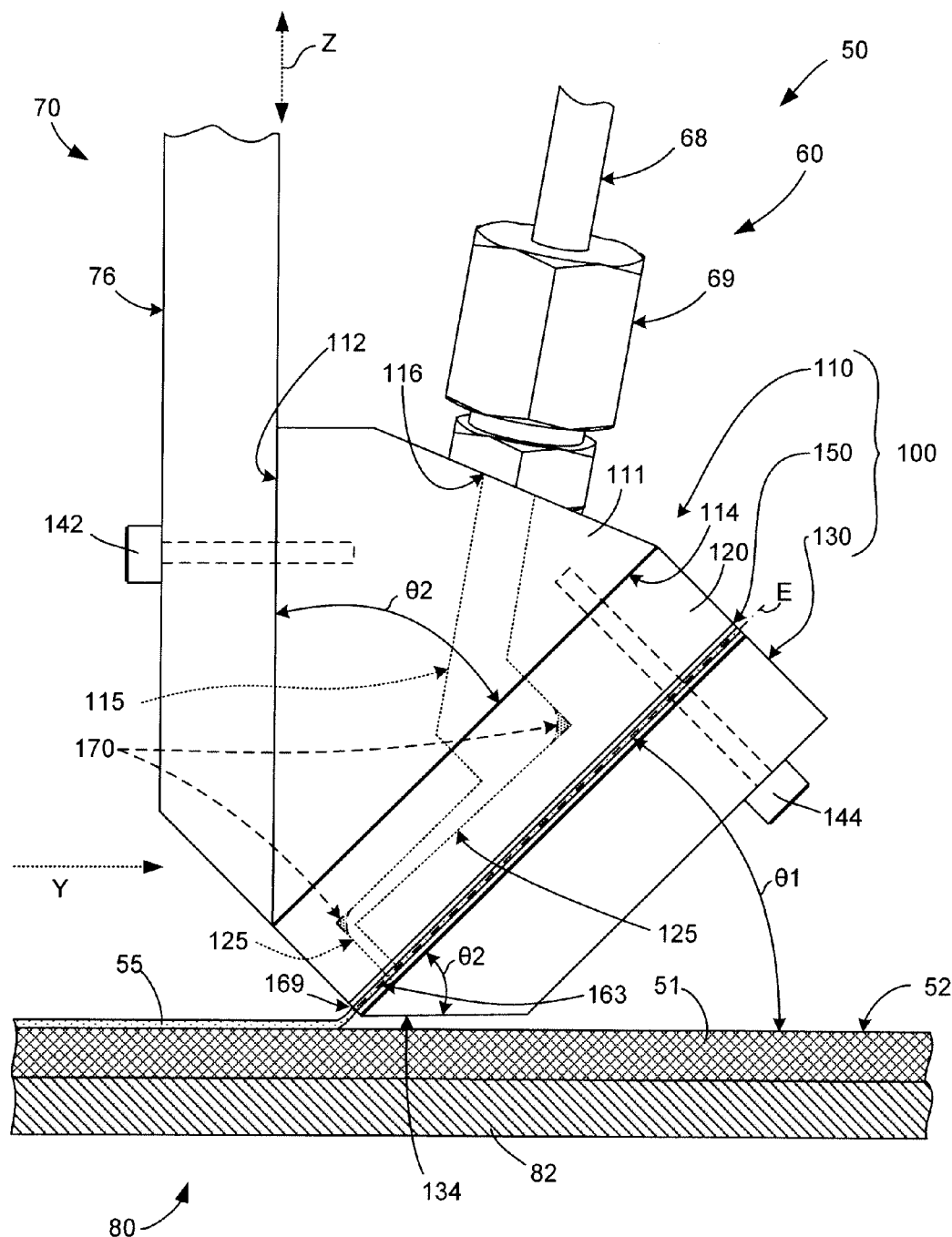
FIG. 1 is a side view showing a portion of a micro-extrusion system including a micro-extrusion printhead assembly formed in accordance with an embodiment of the present invention.

FIG. 1 is a simplified side view showing a portion of a micro-extrusion system 50 for forming parallel extruded material lines 55 on upper surface 52 of a substrate 51. Micro-extrusion system 50 includes an extrusion printhead assembly 100 that is operably coupled to a material feed system 60 by way of at least one feedpipe 68 and an associated fastener 69. The materials are applied through pushing and/or drawing techniques (e.g., hot and cold) in which the materials are pushed (e.g., squeezed, etc.) and/or drawn (e.g., via a vacuum, etc.) through extrusion printhead assembly 100, and out one or more outlet orifices (exit ports) 169 that are respectively defined in a lower portion of printhead assembly 100. Micro-extrusion system 50 also includes an X-Y-Z-axis positioning mechanism 70 including a mounting plate 76 for rigidly supporting and positioning printhead assembly 100 relative to substrate 51, and a base 80 including a platform 82 for supporting substrate 51 in a stationary position as printhead assembly 100 is moved in a predetermined (e.g., Y-axis) direction over substrate 51. In alternative embodiment (not shown), printhead assembly 100 is stationary and base 80 includes an X-Y axis positioning mechanism for moving substrate 51 under printhead assembly 100.

Figure 2:
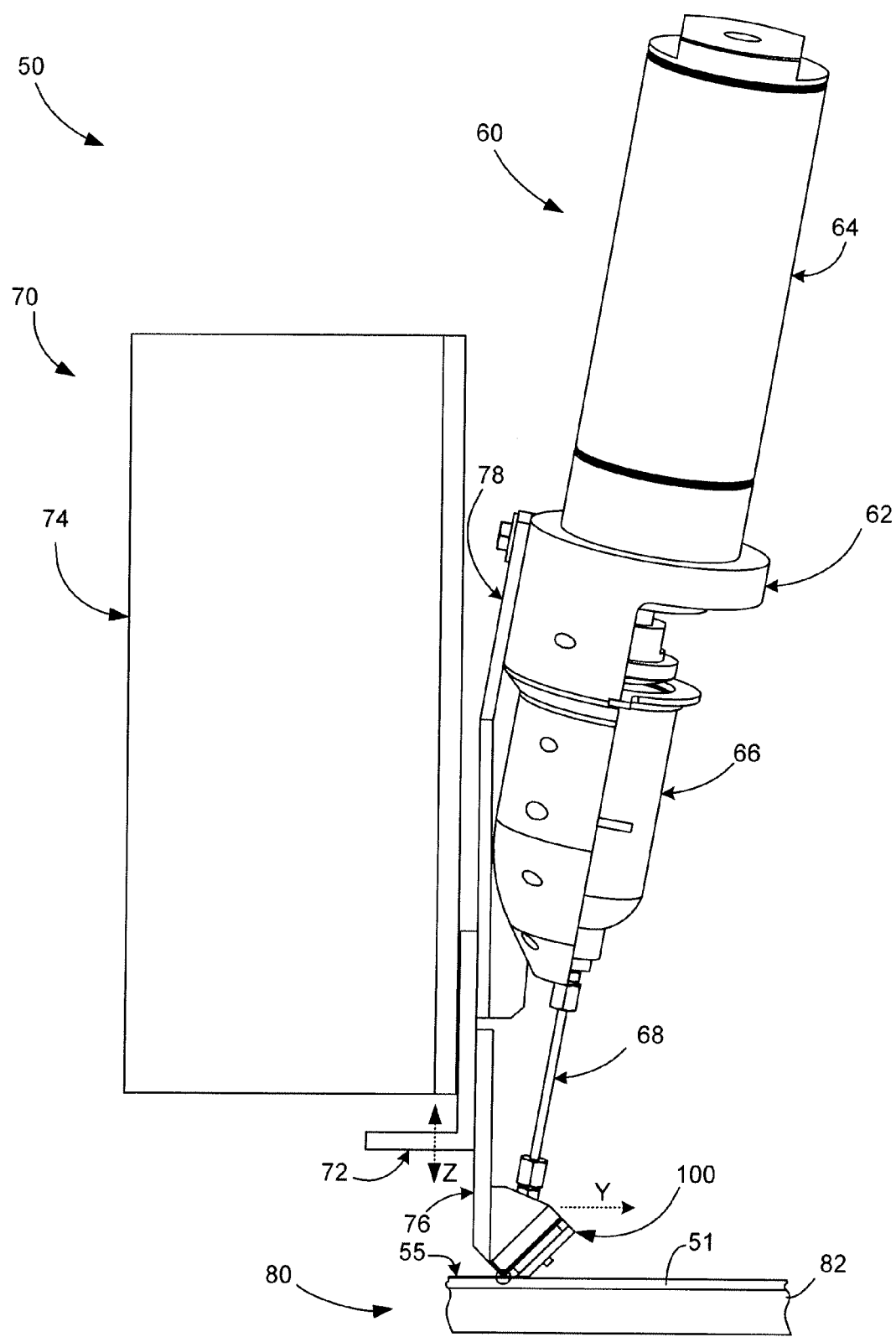
FIG. 2 is a side view showing the micro-extrusion system of FIG. 1 in additional detail.

FIG. 2 shows material feed system 60, X-Y-Z-axis positioning mechanism 70 and base 80 of micro-extrusion system 50 in additional detail. The assembly shown in FIG. 2 represents an experimental arrangement utilized to produce solar cells on a small scale, and those skilled in the art will recognize that other arrangements would typically be used to produce solar cells on a larger scale. Referring to the upper right portion of FIG. 2, material feed system 60 includes a housing 62 that supports a pneumatic cylinder 64, which is operably coupled to a cartridge 66 such that material is forced from cartridge 66 through feedpipe 68 into printhead assembly 100. Referring to the left side of FIG. 2, X-Y-Z-axis positioning mechanism 70 includes a Z-axis stage 72 that is movable in the Z-axis (vertical) direction relative to target substrate 51 by way of a housing/actuator 74 using known techniques. Mounting plate 76 is rigidly connected to a lower end of Z-axis stage 72 and supports printhead assembly 100, and a mounting frame 78 is rigidly connected to and extends upward from Z-axis stage 72 and supports pneumatic cylinder 64 and cartridge 66. Referring to the lower portion of FIG. 2, base 80 includes supporting platform 82, which supports target substrate 51 as an X-Y mechanism moves printhead assembly 100 in the X-axis and Y-axis directions (as well as a couple of rotational axes) over the upper surface of substrate 51 utilizing known techniques.

Figure 3:
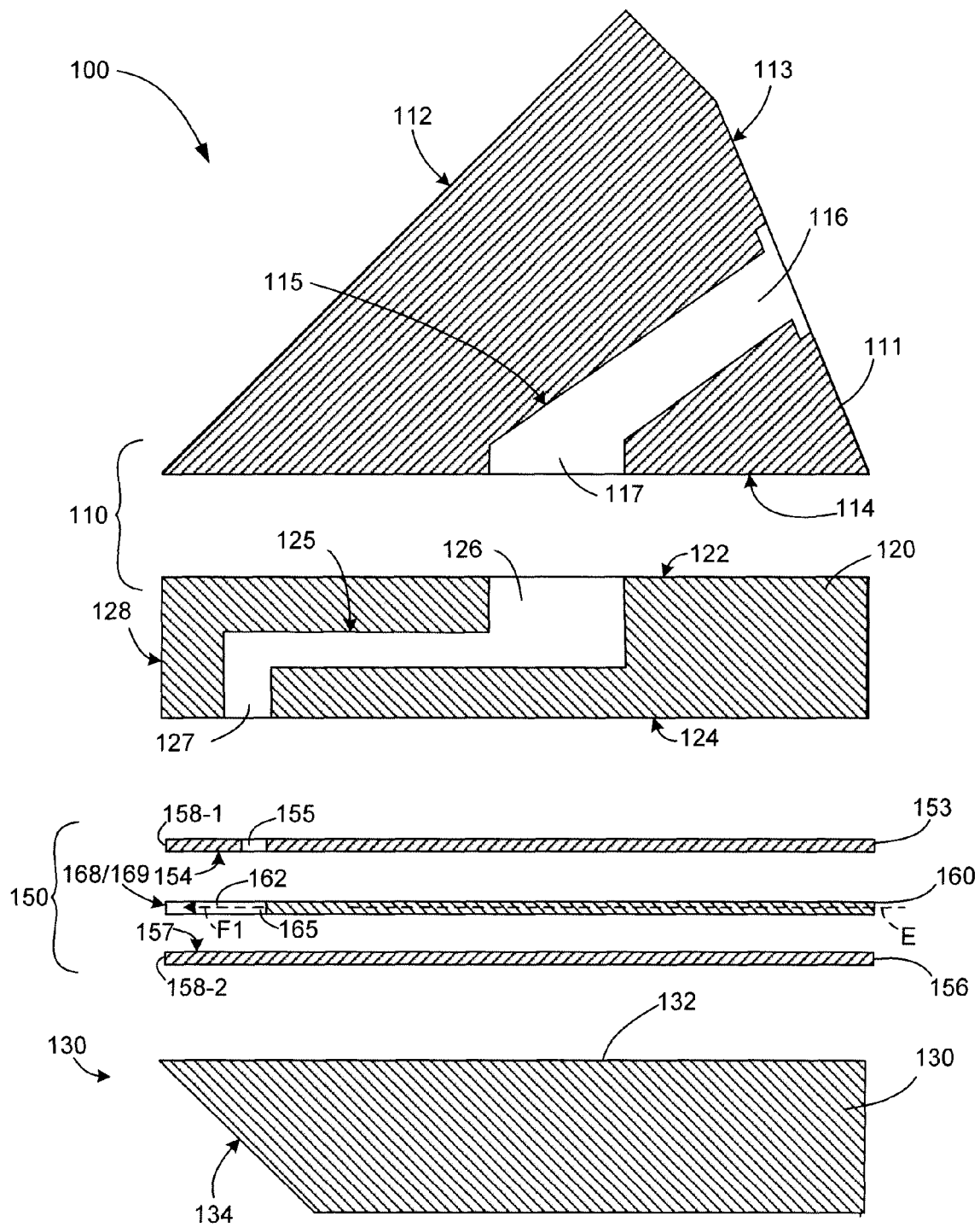
FIG. 3 is an exploded cross-sectional side view showing generalized micro-extrusion printhead assembly utilized in the system of FIG. 1.

As shown in FIG. 1 and in exploded form in FIG. 3, layered micro-extrusion printhead assembly 100 includes a first (back) plate structure 110, a second (front) plate structure 130, and a layered nozzle structure 150 connected therebetween. Back plate structure 110 and front plate structure 130 serve to guide the extrusion material from an inlet port 116 to layered nozzle structure 150, and to rigidly support layered nozzle structure 150 such that extrusion nozzles 163 defined in layered nozzle structure 150 are pointed toward substrate 51 at a predetermined tilted angle θ1 (e.g., 45°), whereby extruded material traveling down each extrusion nozzle 163 toward its corresponding nozzle orifice 169 is directed toward target substrate 51.

Each of back plate structure 110 and front plate structure 130 includes one or more integrally molded or machined metal parts. In the disclosed embodiment, back plate structure 110 includes an angled back plate 111 and a back plenum 120, and front plate structure 130 includes a single-piece metal plate. Angled back plate 111 includes a front surface 112, a side surface 113, and a back surface 114, with front surface 112 and back surface 114 forming a predetermined angle θ2 (e.g., 45°; shown in FIG. 1). Angled back plate 111 also defines a bore 115 that extends from a threaded countersunk bore inlet 116 defined in side wall 113 to a bore outlet 117 defined in back surface 114. Back plenum 120 includes parallel front surface 122 and back surface 124, and defines a conduit 125 having an inlet 126 defined through front surface 122, and an outlet 127 defined in back surface 124. As described below, bore 115 and plenum 125 cooperate to feed extrusion material to layered nozzle structure 150. Front plate structure 130 includes a front surface 132 and a beveled lower surface 134 that form predetermined angle θ2 (shown in FIG. 1).

Layered nozzle structure 150 includes two or more stacked plates (e.g., a metal such as aluminum, steel or plastic) that combine to form one or more extrusion nozzles 163. In the embodiment shown in FIG. 3, layered nozzle structure 150 includes a top nozzle plate 153, a bottom nozzle plate 156, and a nozzle outlet plate 160 sandwiched between top nozzle plate 153 and bottom nozzle plate 156. Top nozzle plate 153 defines an inlet port (through hole) 155, and has a (first) front edge 158-1. Bottom nozzle plate 156 is a substantially solid (i.e., continuous) plate having a (third) front edge 158-2. Nozzle outlet plate 160 includes a (second) front edge 168 and defines an elongated nozzle channel 162 extending in a predetermined first flow direction F1 from a closed end 165 to an nozzle orifice 169 defined through front edge 168. When operably assembled (e.g., as shown in FIG. 1), nozzle outlet plate 160 is sandwiched between top nozzle plate 153 and bottom nozzle plate 156 such that elongated nozzle channel 162, a front portion 154 of top nozzle plate 153, and a front portion 157 of bottom nozzle plate 156 combine to define elongated extrusion nozzle 163 that extends from closed end 165 to nozzle orifice 169. In addition, top nozzle plate 153 is mounted on nozzle outlet plate 160 such that inlet port 155 is aligned with closed end 165 of elongated channel 162, whereby extrusion material forced through inlet port 155 flows in direction F1 along extrusion nozzle 163, and exits from layered nozzle structure 150 by way of nozzle orifice 169 to form bead 55 on substrate 51.

Referring again to FIG. 1, when operably assembled and mounted onto micro-extrusion system 50, angled back plate 111 of printhead assembly 100 is rigidly connected to mounting plate 76 by way of one or more fasteners (e.g., machine screws) 142 such that beveled surface 134 of front plate structure 130 is positioned close to parallel to upper surface 52 of target substrate 51. One or more second fasteners 144 are utilized to connect front plate structure 130 to back plate structure 110 with layered nozzle structure 150 pressed between the back surface of front plate structure 130 and the back surface of back plenum 120. In addition, material feed system 60 is operably coupled to bore 115 by way of feedpipe 68 and fastener 69 using known techniques, and extrusion material forced into bore 115 is channeled to layered nozzle structure 150 by way of conduit 125. The extrusion material exiting conduit 125 enters the closed end of nozzle 163 by way of inlet 155 and closed end 165 (both shown in FIG. 3), and flows in direction F1 down nozzle 163 toward outlet 169. Referring to FIG. 3, the extrusion material flowing in the nozzle (i.e., traveling in direction F1 along channel 162) flows in (or parallel to) a lateral extrusion plane E defined by the nozzle outlet plate 160, and is directed through the outlet orifice (printhead nozzle) 169. Referring back to FIG. 1, because the extruded material is guided along the extrusion plane E at the tilted angle θ2 as it exits nozzle orifice 169, layered micro-extrusion printhead 100 reliably directs the extruded material toward substrate 51 in a manner that facilitates high volume solar cell production.

In a preferred embodiment, as shown in FIG. 1, a hardenable material is injected into bore 115 and conduit 125 of printhead assembly 100 in the manner described in co-owned and co-pending U.S. patent application Ser. No. 12/267,147 entitled "DEAD VOLUME REMOVAL FROM AN EXTRUSION PRINTHEAD", which is incorporated herein by reference in its entirety. This hardenable material forms portions 170 that fill any dead zones of conduit 125 that could otherwise trap the extrusion material and lead to clogs.

According to the present invention, at least one of the nozzle structure materials, the output geometry, and the internal conduit geometry of printhead assembly 100 are modified to causes the extrusion material (bead) traveling through extrusion nozzle 163 (i.e., in or parallel to the lateral extrusion plane E) to be reliably directed (angled) toward the target substrate as it leaves the printhead nozzle orifice. In particular, at least one of top nozzle plate 153, bottom nozzle plate 156, and nozzle outlet plate 160 of the layered nozzle structure is modified such that the extrusion material is directed toward substrate 51 as it exits the extrusion nozzle (i.e., the bead is directed in or downward from lateral extrusion plane E). The modification to printhead assembly 100 takes several forms that are described with reference to the specific embodiments set forth below. In the following description, corresponding structures of the various embodiments are identified using the same base reference numbers, with the suffixes "A" to "F" added to selected reference numbers in order to delineate differences associated with the various specific embodiments.

Figure 4:
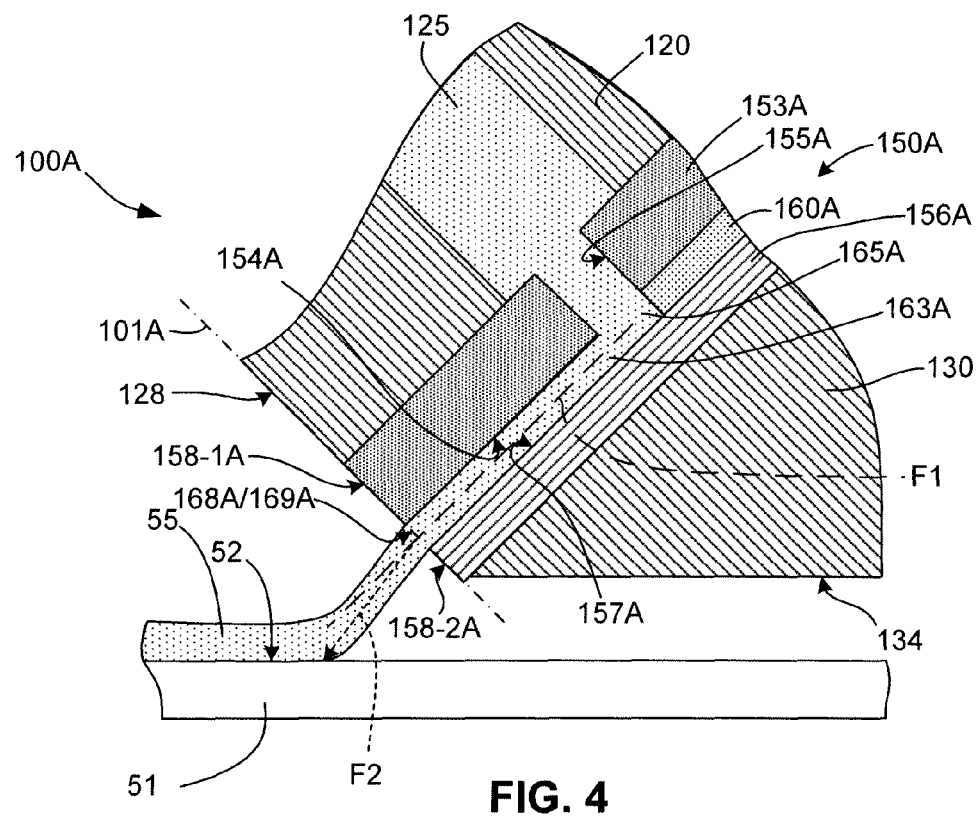
FIG. 4 is a cross-sectional side view showing a portion of a micro-extrusion printhead assembly during operation according to a first specific embodiment of the present invention.

FIG. 4 is a simplified cross-sectional side view showing a portion of a printhead assembly 100A according to a first specific embodiment of the invention. In accordance with the first specific embodiment, the inventors have determined that the direction of a bead as it exits a nozzle is influenced by the materials utilized to form the upper, lower and side wall surfaces of the nozzle. For example, the inventors found that when the top nozzle plate is composed of a first polyimide material (e.g., Cirlex™) and nozzle outlet and bottom nozzle plates are composed of a second polyimide material (e.g., Kapton™), the bead tends to bend upward and forms an undesirable blob of ink on the printhead. Since in this case both materials are forms of polyimide, it is believed that the preferred direction for the ink bead may be influenced by the passageways inside the printhead, upstream of the nozzles (i.e., asymmetry in the stress generated in the extruded material that is created by the channel walls prior to extrusion). An alternative explanation is that there is a sufficient difference in the surface properties (e.g., surface energy), due to different manufacturing processes, between the thicker Cirlex™ and thinner Kapton™ layers to create a difference in the affinity of the ink for the materials, even though they are both polyimides. Conversely, the inventors also found that when the dissimilar materials are interchanged in particular arrangements, the resulting printhead produces reliable downward flow of the bead. This illustrates that the dissimilarity in the materials does not necessarily need to be in the bulk properties, but rather, the surface properties are most critical.

Referring to FIG. 4, printhead assembly 100A includes a layered nozzle structure 150A sandwiched between a back plenum 120 and a front plate structure 130A, which are similar to those described above with reference to FIG. 3. Back plenum 120 defines a conduit 125 that communicates with a closed end 165A of a nozzle 163A by way of an inlet port 155A defined through top nozzle plate 153A. In combination with side walls formed by nozzle outlet plate 160A (not shown), portion 154A of top nozzle plate 153A and portion 157A of bottom nozzle plate 156A form the upper and lower walls, respectively, of nozzle 163A, whereby extrusion material entering nozzle 163A from conduit 125 generally flows along the dashed line F1 to outlet orifice 169A. Note that front edge 168A of nozzle outlet plate 160A, front edge 158-1A of top nozzle plate 153A, and front edge 158-2A of bottom nozzle plate 156A are coplanar with front edge 128 of back plenum 120, forming a front edge 101A of printhead assembly 100A. In one exemplary embodiment, a thickness of top nozzle plate 153A is 300 microns, bottom nozzle plate 156A is 25 microns thick, nozzle outlet plate 160A is 50 microns thick, a width of nozzle orifice 169A is 200 microns, and a length of nozzle 163A is 2000 microns.

In accordance with the first specific embodiment, top nozzle plate 153A is formed using a solid plate of a first polyimide material (e.g., Cirlex), bottom nozzle plate 156A is formed using a solid plate of stainless steel, and nozzle outlet plate 160A is formed using a solid plate of a second polyimide material (e.g., Kapton). Due to the different surface properties of the two materials forming the upper wall portion 154A and lower wall portion 157A of nozzle 163A, undesired curling of bead 55 away from substrate 51 is beneficially reduced or eliminated. In particular, because the surface energy of the Cirlex forming upper wall portion 154A has a lesser affinity for the ink/paste than that of the stainless steel forming lower wall portion 157A, bead 55 is reliably directed downward upon leaving outlet orifice 169A, thereby facilitating high volume solar panel production. Those skilled in the art will recognize that the selected materials (i.e., Cirlex, stainless steel and Kapton) are exemplary, and not intended to be limiting.

According to another approach to achieving the bead biasing characteristic of the invention, the output (i.e., nozzle outlet) geometry of the printhead assembly is modified in a way that biases the extruded bead toward the substrate. In the following specific embodiments, described with reference to FIGS. 5-7, this biasing mechanism is achieved by forming the printhead such that the upper edge of the orifice (outlet opening) extends downstream along the lateral extrusion plane in the downstream direction of the extruded bead (i.e., closer to the substrate) than the lower edge of the orifice.

Figure 5:
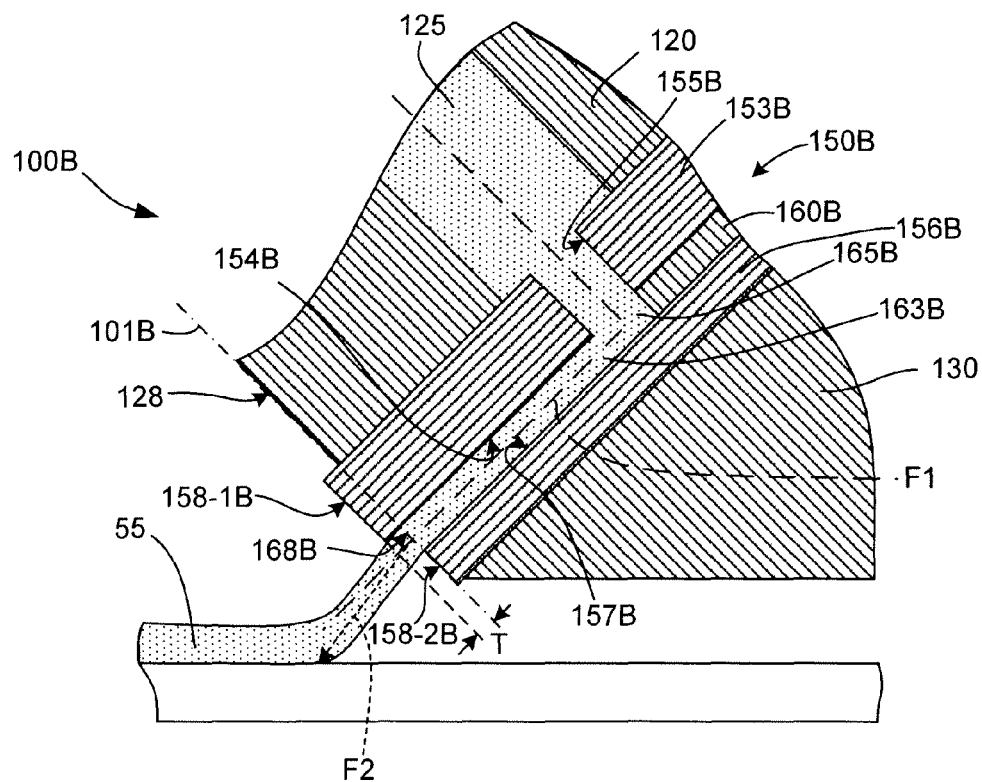
FIG. 5 is a cross-sectional side view showing a portion of a micro-extrusion printhead assembly during operation according to a second specific embodiment of the present invention.

In accordance with the specific embodiment shown in FIG. 5, printhead assembly 100B includes a layered nozzle structure 150B sandwiched between a back plenum 120 and a front plate structure 130, which are similar to those described above with reference to FIG. 3. Conduit 125 communicates with a closed end 165B of a nozzle 163B by way of an inlet port 155B defined through top nozzle plate 153B. Portion 154B of top nozzle plate 153B and portion 157B of bottom nozzle plate 156B form the upper and lower walls, respectively, of nozzle 163B, whereby extrusion material entering nozzle 163B from conduit 125 generally flows along the dashed line F1 to outlet orifice 169B. In accordance with this specific embodiment, top nozzle plate 153B and bottom nozzle plate 156B are mounted on the nozzle outlet plate 160B such that front edge 168B of nozzle outlet plate 160B and front edge 158-2B of bottom nozzle plate 156B are coplanar with front edge 128 of back plenum 120, forming a front edge 101B of printhead assembly 100B, but front edge 158-1B of top nozzle plate 153B protrudes a distance T equal to or greater than one-half of the height of the nozzle (e.g. 30 μm or more, preferably 50 μm) farther downstream than front edges 158B-2 and 168B. Due to the constraint imposed by the extension of top nozzle plate 153B, the extrusion material flow is deflected away from the extended upper wall 154B, which the present inventors have found to reliably reduce or eliminate the curling of bead 55 away from substrate 51 (i.e., in the direction of arrow F2). The extension of upper wall 154B has the effect of forcing the extruded material down and away from printhead assembly 100B as it exits nozzle orifice 169B. This may be caused in part by the die swell of the extruded material (ink) as it exits. The die swell effects can be considerable in this arrangement because of the large shear rates ($1000\ s^{-1}$) involved and the elasticity of the complex rheological fluids employed.

Figure 6:
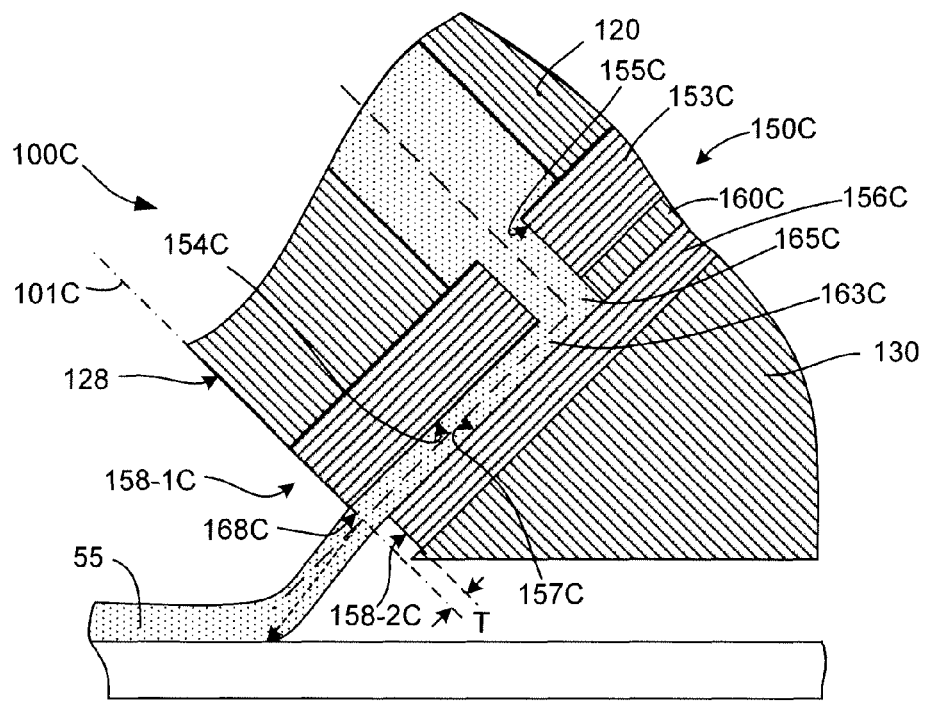
FIG. 6 is a cross-sectional side view showing a portion of a micro-extrusion printhead assembly during operation according to a third specific embodiment of the present invention.

In accordance with the specific embodiment shown in FIG. 6, printhead assembly 100C includes a layered nozzle structure 150C between a back plenum 120 and a front plate structure 130, and conduit 125 communicates with a closed end 165C of a nozzle 163C by way of an inlet port 155C defined through top nozzle plate 153C substantially as described above. Portion 154C of top nozzle plate 153C and portion 157C of bottom nozzle plate 156C form the upper and lower walls, respectively, of nozzle 163C. In accordance with this specific embodiment, top nozzle plate 153C and bottom nozzle plate 156C are mounted on nozzle outlet plate 160C such that second front edge 168C of nozzle outlet plate 160C and first front edge 158-1C of top nozzle plate 153C are coplanar and define a front edge 101C of printhead assembly 100C, and such that third front edge 158-2C of bottom nozzle plate 156C is recessed such that front edge 101C protrudes the predetermined distance T (i.e., 30 μm or more, preferably 50 μm) farther in the downstream direction than third front edge 158-2C. Similar to the previous embodiment in which the top nozzle plate is extended, recessing lower nozzle plate 156C produces a downward force on the upper region of bead 55, reliably reducing or eliminating the undesired curling of bead 55 away from plate 51.

Figure 7:
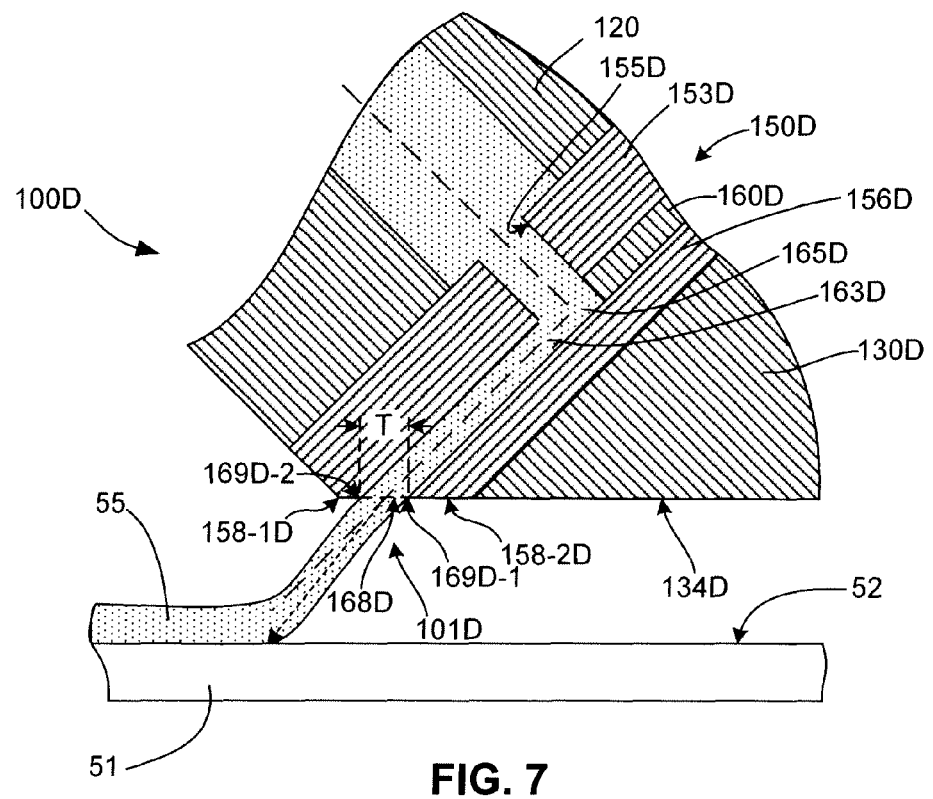
FIG. 7 is a cross-sectional side view showing a portion of a micro-extrusion printhead assembly during operation according to a fourth specific embodiment of the present invention.

In accordance with the specific embodiment shown in FIG. 7, a printhead assembly 100D includes a layered nozzle structure 150D, a back plenum 120 and a front plate structure 130D arranged substantially as described above. However, printhead assembly 100D differs from previous embodiments in that a bottom nozzle plate 156D and a nozzle outlet plate 160D of layered nozzle structure 150D are beveled (chamfered) such that front edge 168D of the nozzle outlet plate 160D and the third front edge 158-2D of the bottom nozzle plate 156D are coplanar and define a planar orifice edge 101D that is close to parallel to the upper surface 52 of the target substrate 51, and coplanar with beveled lower surface 134D of front plate structure 130D. That is, the plane defined by beveled lower surface 134D (which is maintained substantially parallel to surface 52 during the extrusion operation) bisects bottom nozzle plate 156D and nozzle outlet plate 160D, whereby the nozzle outlet is defined in the bottom chamfer such that the "lower" nozzle outlet edge 169D-1 of nozzle outlet is upstream of the "upper" nozzle outlet edge 169D-2 and separated by the desired distance T. Similar to the previous embodiments in which the top/bottom nozzle plates are extended/recessed, the beveled arrangement of printhead 100D produces a downward force on the upper region of bead 55, reducing or eliminating undesirable curling of the bead away from the substrate. A further advantage of forming the nozzle outlet in the chamfer (i.e., forming front edge 168D coplanar with beveled lower surface 134D) is that the surface of printhead assembly 100D defining the nozzle outlet remains planar and, making it easier to clean in comparison to the protruding/recessed plate embodiments mentioned above. Note that the chamfered surface may extend to include part or all of front edge 158-1D of top nozzle plate 153D, and even extend to include part of back plenum 120 to provide a larger planar surface orifice edge 101D that is even easier to clean. Note also that layer 156D is "optional" in that the bottom surface of the nozzles could be formed by the top plate 130D.

FIGS. 8-12 illustrate a co-extrusion system 50E according to another embodiment of the present invention. Co-extrusion system 50E includes a Z-axis positioning mechanism and X-Y axis positioning mechanism that are constructed and function in a manner similar to that described above with reference to FIGS. 1 and 2. As set forth in the following paragraphs, co-extrusion system 50E differs from the above-described embodiments in that it includes material feed system 60E having means for supplying two extrusion materials to a printhead assembly 100E, and printhead assembly 100E includes means for co-extruding the two extrusion materials in a manner that generates parallel high-aspect ratio gridline structures (described below with reference to FIG. 12).

Figure 8:
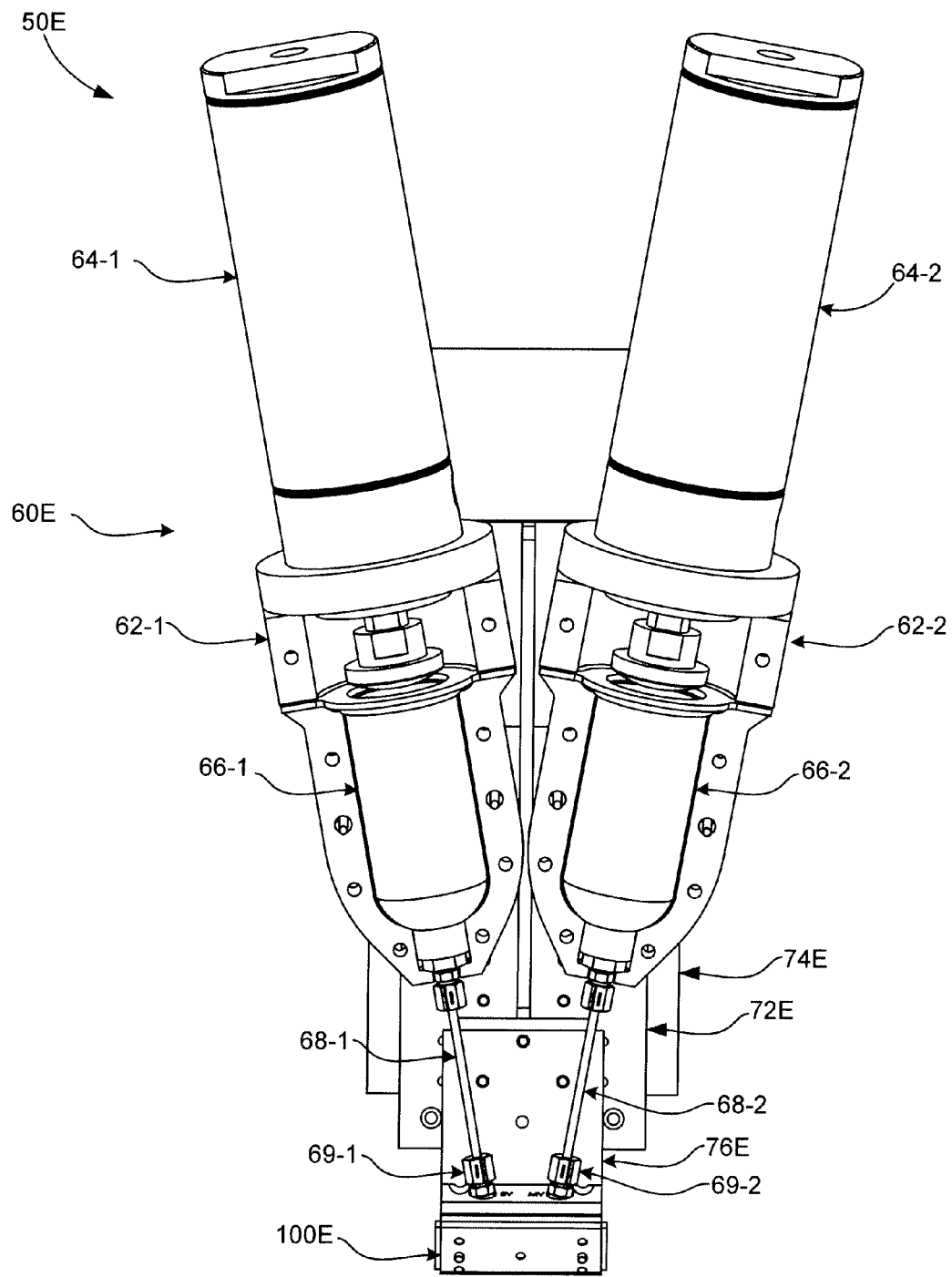
FIG. 8 is a front view showing a micro-extrusion system including a generalized co-extrusion printhead assembly according to another embodiment of the present invention.

Referring to FIG. 8, material feed system 60E represents exemplary experimental arrangement utilized to produce solar cells on a small scale, and those skilled in the art will recognize that other arrangements would typically be used to produce solar cells on a larger scale. Referring to the upper portion of FIG. 8, material feed system 60E includes a pair of housings 62-1 and 62-2 that respectively support pneumatic cylinders 64-1 and 64-2, which is operably coupled to cartridges 66-1 and 66-2 such that material forced from these cartridges respectively passes through feedpipes 68-1 and 68-2 into printhead assembly 100E. As indicated in the lower portion of FIG. 8, the Z-axis positioning mechanism (partially shown) includes a Z-axis stage 72E that is movable in the Z-axis (vertical) direction by way of a housing/actuator 74E (partially shown) using known techniques. Mounting plate 76E is rigidly connected to a lower end of Z-axis stage 72E and supports printhead assembly 100E, and a mounting frame (not shown) is rigidly connected to and extends upward from Z-axis stage 72E and supports pneumatic cylinders 64-1 and 64-2 and cartridges 66-1 and 66-2.

Figure 9:
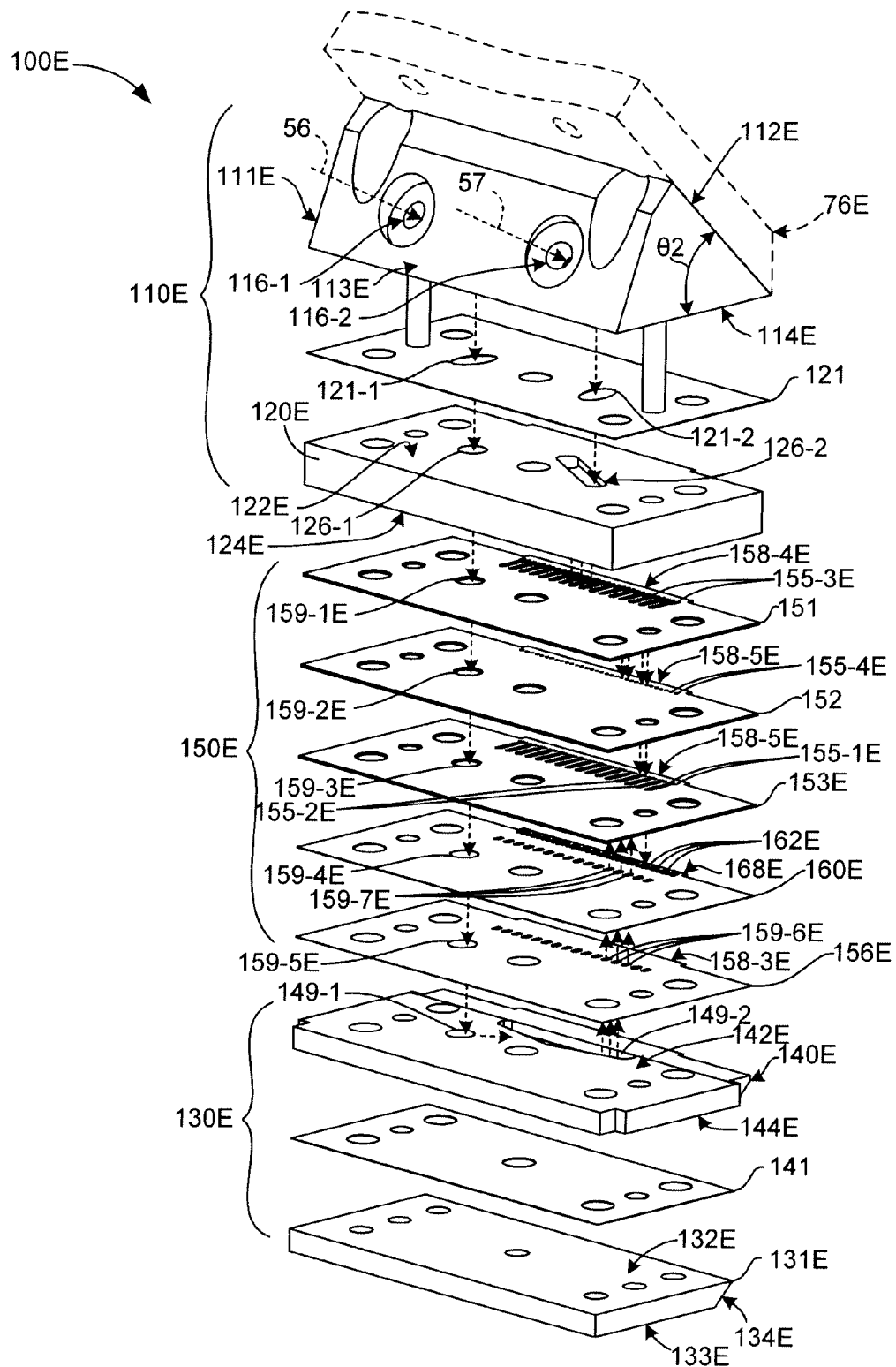
FIG. 9 is an exploded perspective view showing the co-extrusion printhead assembly of FIG. 8 in additional detail.

FIG. 9 is an exploded perspective view showing micro-extrusion printhead 100E in additional detail. Micro-extrusion printhead 100E includes a first (back) plate structure 110E, a second (front) plate structure 130E, and a layered nozzle structure 150E connected therebetween.

Back plate structure 110E and front plate structure 130E serve to guide the extrusion material from corresponding inlet ports 116-1 and 116-2 to layered nozzle structure 150E, and to rigidly support layered nozzle structure 150E such that extrusion nozzles 162E defined in layered nozzle structure 150E are pointed toward substrate 51 at a predetermined tilted angle (e.g., 45°), whereby extruded material traveling down each extrusion nozzle 162E toward its corresponding nozzle orifice 169E is directed toward target substrate 51.

Referring to the upper portion of FIG. 9, back plate structure 110E includes a molded or machined metal (e.g., aluminum) angled back plate 111E, a back plenum 120E, and a back gasket 121 disposed therebetween. Angled back plate 111E includes a front surface 112E, a side surface 113E, and a back surface 114E, with front surface 112E and back surface 114E forming predetermined angle $\theta 2$ (e.g., 45°). Angled back plate 111E also defines a pair of bores (not shown) that respectively extend from threaded countersunk bore inlets 116-1 and 116-2 defined in side wall 113E to corresponding bore outlets defined in back surface 114E. Back plenum 120E includes parallel front surface 122E and back surface 124E, and defines a pair of conduits (not shown) extending from corresponding inlets 126-1 and 126-2 defined through front surface 122 to corresponding outlets (not shown) defined in back surface 124E. Similar to the description provided above, the bores/conduits defined through back plate structure 110E feed extrusion material to layered nozzle structure 150E.

Referring to the lower portion of FIG. 9, front plate structure 130E includes a molded or machined metal (e.g., aluminum) front plate 131E, a front plenum 140E, and a front gasket 141 disposed therebetween. Front plate 131E includes a front surface 132E, a side surface 133E, and a beveled back surface 134E, with front surface 132E and back surface 134E forming the predetermined angle described above. Front plate 131E defines several holes for attaching to other sections of printhead assembly 100E, but does not channel extrusion material. Front plenum 140E includes parallel front surface 142E and back surface 144E, and defines a conduit (not shown) extending from corresponding inlet 148 to a corresponding outlet 149, both being defined through front surface 142E. As described below, the conduit defined in front plenum 140E serves to feed one of the extrusion materials to layered nozzle structure 150E.

Similar to the single material embodiment, described above, layered nozzle structure 150E includes a top nozzle plate 153E, a bottom nozzle plate 156E, and a nozzle outlet plate 160E sandwiched between top nozzle plate 153E and bottom nozzle plate 156E. As described in additional detail below, top nozzle plate 153E defines a row of substantially circular inlet ports (through holes) 155-1E and a corresponding series of elongated inlet ports 155-2E that are aligned adjacent to a (first) front edge 158-1E. Bottom nozzle plate 156E is a substantially solid (i.e., continuous) plate having a (third) front edge 158-2E, and defines several through holes 159-6E, whose purpose is described below. Nozzle outlet plate 160E includes a (second) front edge 168E, and defines a row of three-part nozzle channels 162E that are described in additional detail below, and several through holes 159-7E that are aligned with through holes 159-6E. When operably assembled, nozzle outlet plate 160E is sandwiched between top nozzle plate 153E and bottom nozzle plate 156E to form a series of nozzles in which each three-part nozzle channel 162E is enclosed by corresponding portions of top nozzle plate 153E and bottom nozzle plate 156E in the manner described above, with each part of three-part nozzle channel 162E aligned to receive material from two inlet ports 155-1E and one elongated inlet port 155-2E. As described in additional detail below, this arrangement produces parallel high-aspect ratio gridline structures (beads) in which a gridline material is pressed between two sacrificial material sections.

In addition to top nozzle plate 153E, bottom nozzle plate 156E and nozzle outlet plate 160E, layered nozzle structure 150E also includes a first feed layer plate 151 and a second feed layer plate 152 that are stacked over top nozzle plate 153E and served to facilitate the transfer of the two extrusion materials to nozzle outlet plate 160E in the desired manner described below. First feed layer plate 151 is a substantially solid (i.e., continuous) plate having a (fourth) front edge 158-4E, and defines several Y-shaped through holes 155-3E located adjacent to front edge 158-4E, and several feed holes 159-1E whose purposes are described below. Second feed layer plate 152 is disposed immediately below first feel layer plate 151, includes a (fifth) front edge 158-5E, and defines several substantially circular through holes 155-4E located adjacent to front edge 158-5E, and several feed holes 159-2E whose purposes are described below.

Figure 10:
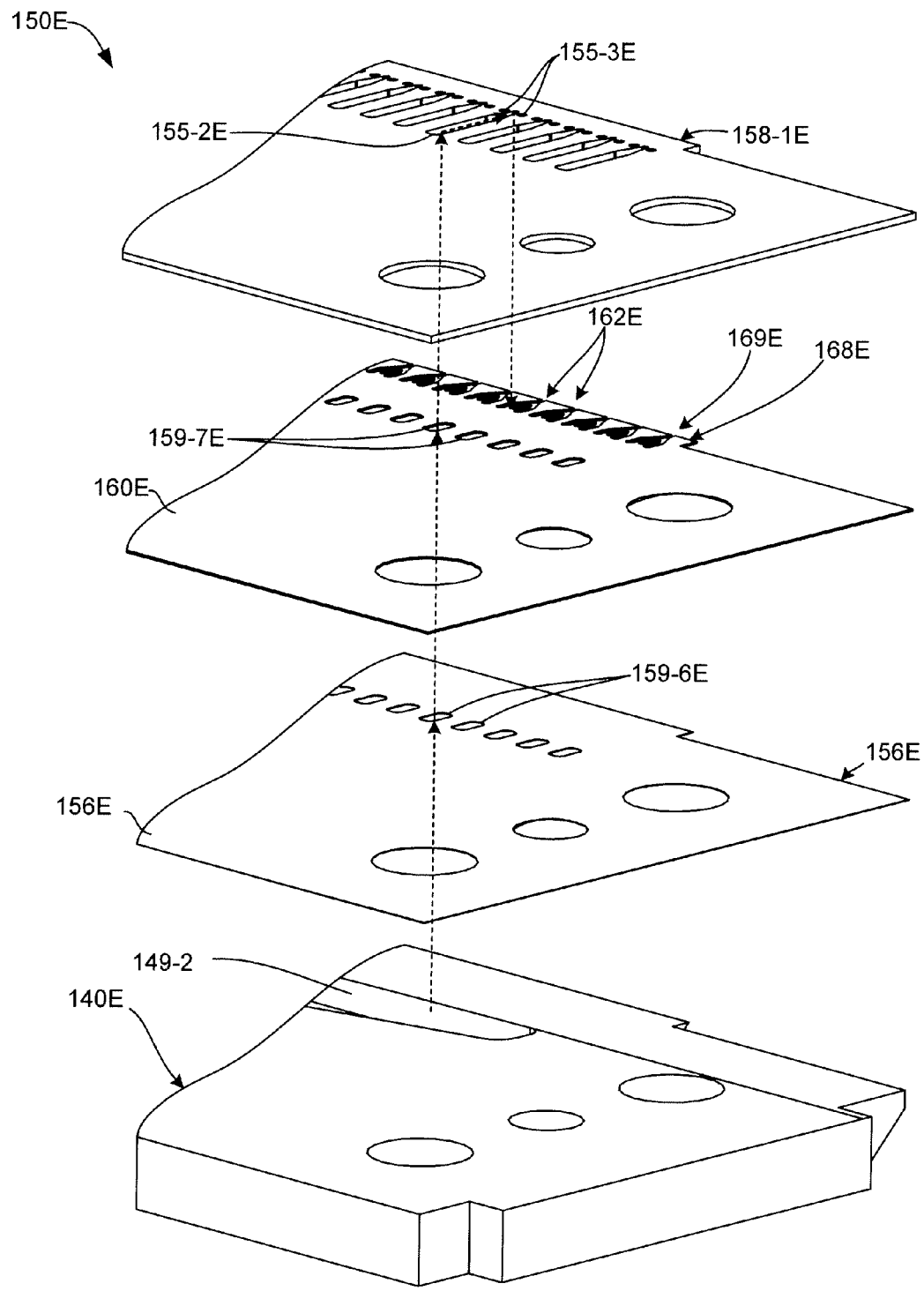
FIG. 10 is an exploded partial perspective view showing a portion of the printhead assembly of FIG. 9 in additional detail.
Figure 11:
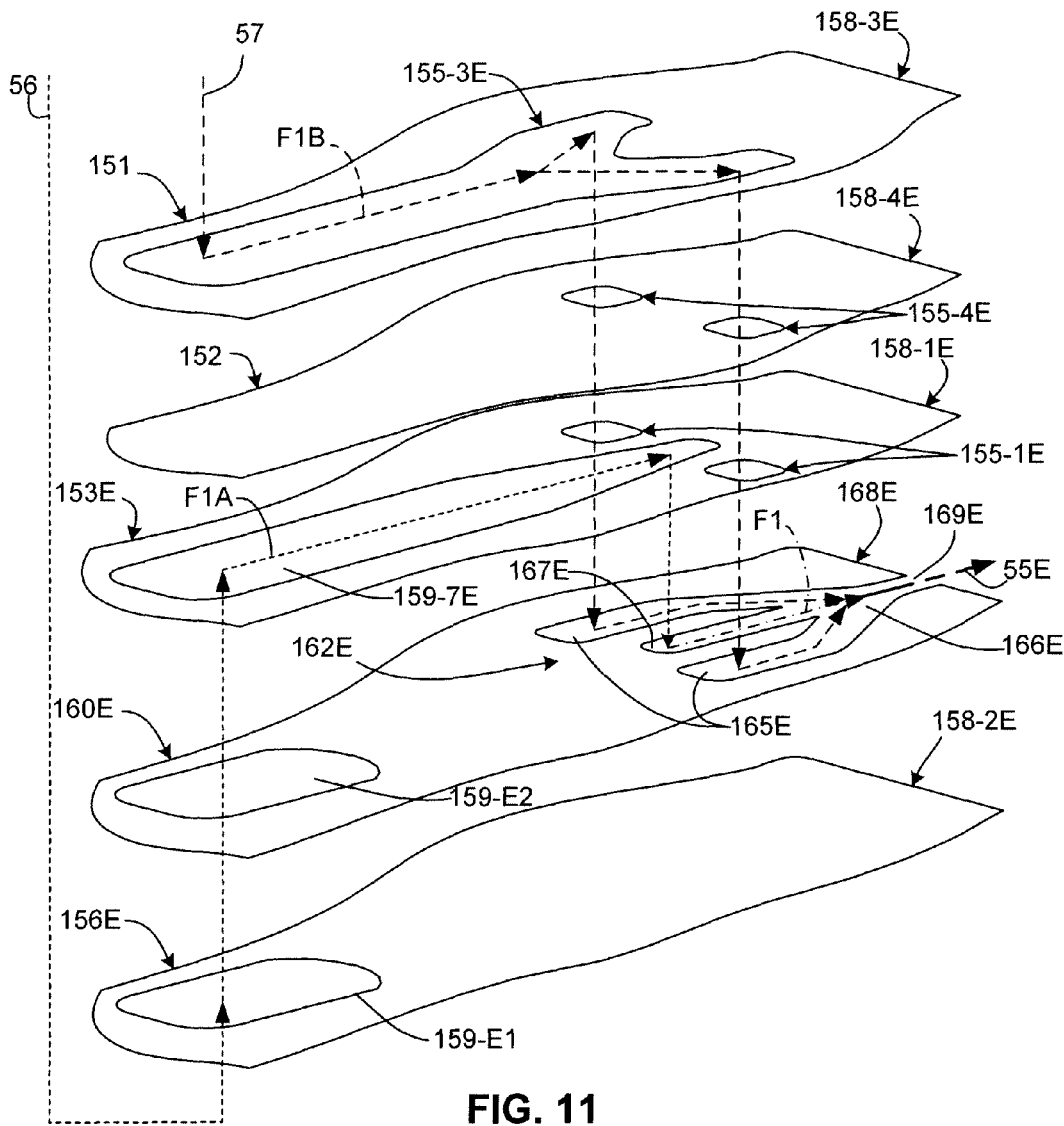
FIG. 11 is a simplified exploded partial perspective view showing a portion of a generalized layered nozzle structure utilized in the co-extrusion printhead assembly of FIG. 8.

As indicated by the dashed arrows in FIG. 9 and described in additional detail in FIGS. 10 and 11, two extrusion materials are fed by way of two separate paths in a substantially Z-axis direction through the various layers of layered nozzle structure 150E to nozzle outlet plate 160E. The two flow paths are described in detail in the following paragraphs.

Referring to the upper portion of FIG. 9, gridline material 56 injected through inlet port 116-1 is fed downward through opening 121-1 in back gasket 121 and into opening 126-1 defined in back plenum 120E. The gridline material then exits back plenum 120E and passes through aligned openings 159-1E to 159-5E respectively formed in first feed layer plate 151, second feed layer plate 152, top nozzle plate 153E, nozzle outlet plate 160E, and bottom nozzle plate 156E before entering opening 149-1 of front plenum 140E. As indicated in FIG. 9 and in additional detail in FIG. 10, the gridline material is then redirected by front plenum 140E and moves upward from opening 149-2 through opening 159-6E formed in bottom nozzle plate 156E and opening 159-7E formed in nozzle outlet plate 160E. As indicated in the upper portion of FIG. 10 and in FIG. 11, the gridline material then enters the rearward end of elongated openings 159-7E, and is redirected in a substantially horizontal direction along arrow F1A to the front end of elongated opening 159-7E. The gridline material is then forced downward into a central channel 167 of three-part nozzle channel 162E. As described in additional detail below, the gridline material then flows along central channel 167E in the direction of arrow F1, and is compressed between corresponding sacrificial material portions before exiting from orifice 169E.

Referring again to the upper portion of FIG. 9, sacrificial material 57 injected through inlet port 116-2 is fed downward through opening 121-2 in back gasket 121 and into opening 126-2 defined in back plenum 120E. The sacrificial material is dispersed by plenum 120E and is passed into the rearward end of Y-shaped elongated channels 155-3E, which are formed in first feed layer plate 151. As indicated by dashed arrows in FIGS. 9 and 11, the sacrificial material flows along each Y-shaped elongated channel 155-3E to a split front end region, where the sacrificial material is distributed through corresponding openings 155-4E disposed in second feed layer plate 152 and openings 155-1E disposed in top nozzle plate 153E, and then into opposing side channel 165E of three-part nozzle channel 162E. As described in additional detail below, the sacrificial material then flows along side channels 165E, and presses against the corresponding gridline material before exiting from orifice 169E.

Referring to FIG. 11, nozzle output plate 160E includes a plate that is micro-machined (e.g., using deep reactive ion etching) to include arrowhead-shaped three-part nozzle channel 162E including a central channel 167E and opposing (first and second) side channels 165E. Central channel 167E is separated from each side channel 165E by an associated tapered finger of plate material. Central channel 167E has a closed end that is aligned to receive gridline material from the front end of elongated opening 159-7E of top nozzle plate 153E, and an open end that communicates with a merge point 166E. Similarly, side channels 165E have associated closed ends that are aligned to receive sacrificial material from corresponding openings 155-1E of top nozzle plate 153E, and open ends that communicate with a merge point 166E. Side channels 165E are angled toward central channel 167E such that sacrificial material is fed against opposing sides of the gridline material flowing in central channel 167E.

Figure 12:
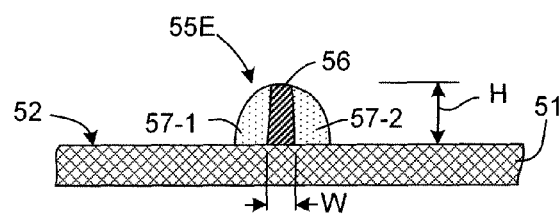
FIG. 12 is a cross-sectional side view showing an exemplary co-extruded gridline structure generated on a substrate surface by the co-extrusion printhead assembly of FIG. 8.

As shown in FIG. 12, the gridline material and sacrificial material co-extruded through each nozzle outlet orifice 169E (see FIG. 11) of co-extrusion printhead assembly 100E during the extrusion process forms an elongated extruded structure 55E on surface 52 of substrate 51 such that the gridline material of each structure 55E forms a high-aspect ratio gridline structure 56, and such that the sacrificial material of each structure 55E forms associated first and second sacrificial material portions 57-1 and 57-2 respectively disposed on opposing sides of the associated high-aspect ratio gridline 56. The shape of extruded structures 55E (i.e., the aspect ratio of gridline material 56 and the shape of sacrificial portions 57-1 and 57-2) are controllable through at least one of the shapes of the one or more outlet orifices and internal geometry of printhead assembly 100E, characteristics of the materials (e.g., viscosity, etc.), and the extrusion technique (e.g., flow rate, pressure, temperature, etc.). As set forth in the specific embodiment described below, the structure within the printhead assembly and the shape of the nozzle outlet orifices may be modified to further enhance the extrusion process. Suitable gridline materials 56 include, but are not limited to, silver, copper, nickel, tin, aluminum, steel, alumina, silicates, glasses, carbon black, polymers and waxes, and suitable sacrificial materials 112 include plastic, ceramic, oil, cellulose, latex, polymethylmethacrylate etc., combinations thereof, and/or variations thereof, including combining the above with other substances to obtain a desired density, viscosity, texture, color, etc. To limit the tendency for the materials to intermix after extrusion, extruded beads leaving co-extrusion printhead 100E can be quenched on substrate 51 by cooling the substrate using known techniques. Alternately, the gridline (ink) material used may be a hot-melt material, which solidifies at ambient temperatures, in which case co-extrusion printhead 100E is heated, leaving the extruded structures to solidify once they are dispensed onto substrate 51. In another technique, the materials can be cured by thermal, optical and/or other means upon exit from co-extrusion printhead 100E. For example, a curing component can be provided to thermally and/or optically cure the materials. If one or both materials include an ultraviolet curing agent, the material can be bound up into solid form in order to enable further processing without mixing.

In accordance with alternative embodiments of the present invention, printhead assembly 100E is produced in accordance with any of the various specific embodiments described above with reference to FIGS. 4-7. For example, top nozzle plate 153E, the bottom nozzle plate 156E and the nozzle outlet plate 160E may be produced using the materials described above with reference to FIG. 4. Further, as illustrated in FIGS. 9-11 and mentioned above, each of the top nozzle plate 153E, the bottom nozzle plate 156E and the nozzle outlet plate 160E have front edges that are substantially aligned to form a front edge of printhead assembly 100E, and may be adjusted (i.e., extended or recessed) to produce structures similar to those described above with reference to FIGS. 5 and 6. Moreover, printhead 100E may be beveled as described above with reference to FIG. 7 in order to position its nozzle outlets along a lower horizontal surface.

Figure 13:
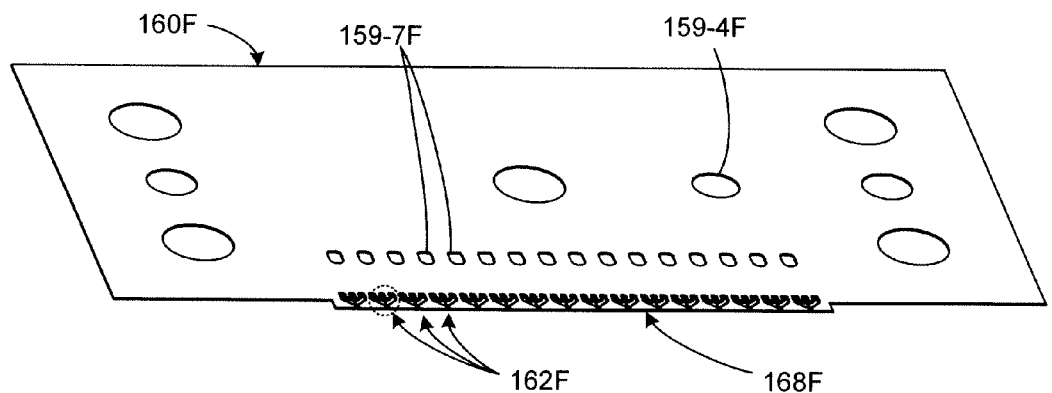
FIG. 13 is a perspective view showing a nozzle outlet plate of a layered nozzle structure utilized in a co-extrusion printhead assembly according to another specific embodiment of the present invention.
Figure 14:
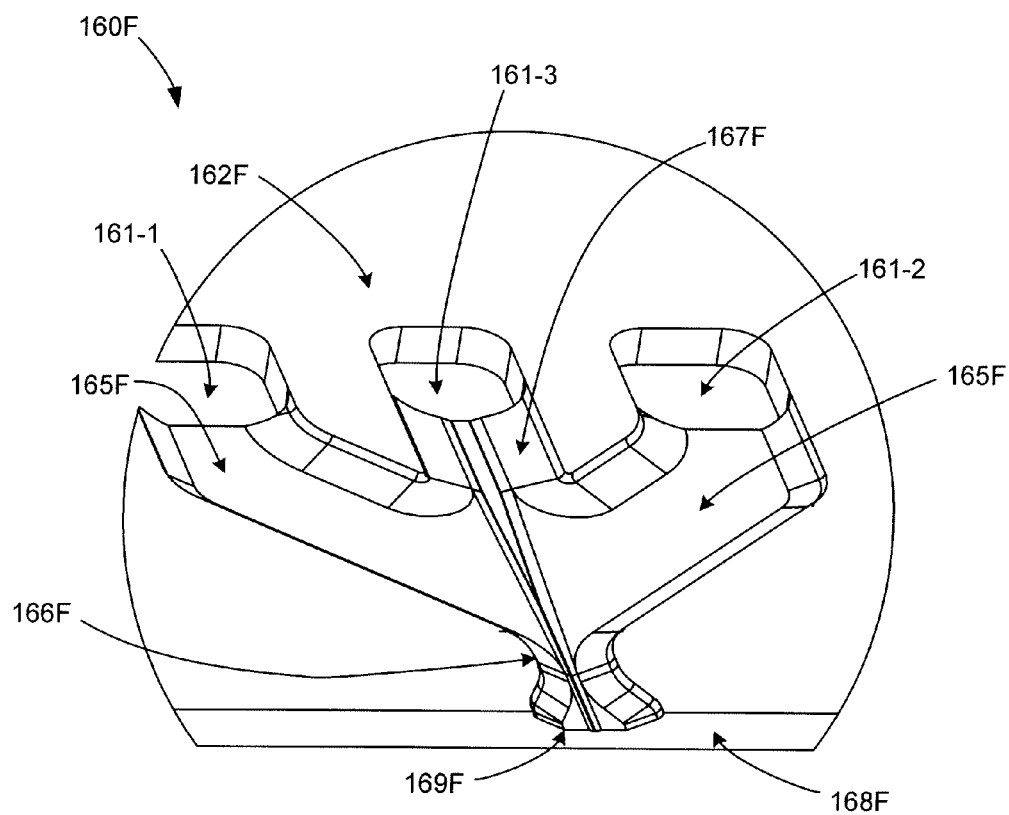
FIG. 14 is an enlarged perspective view showing a three-part nozzle channel formed in the nozzle outlet plate of FIG. 13.
Figure 15:
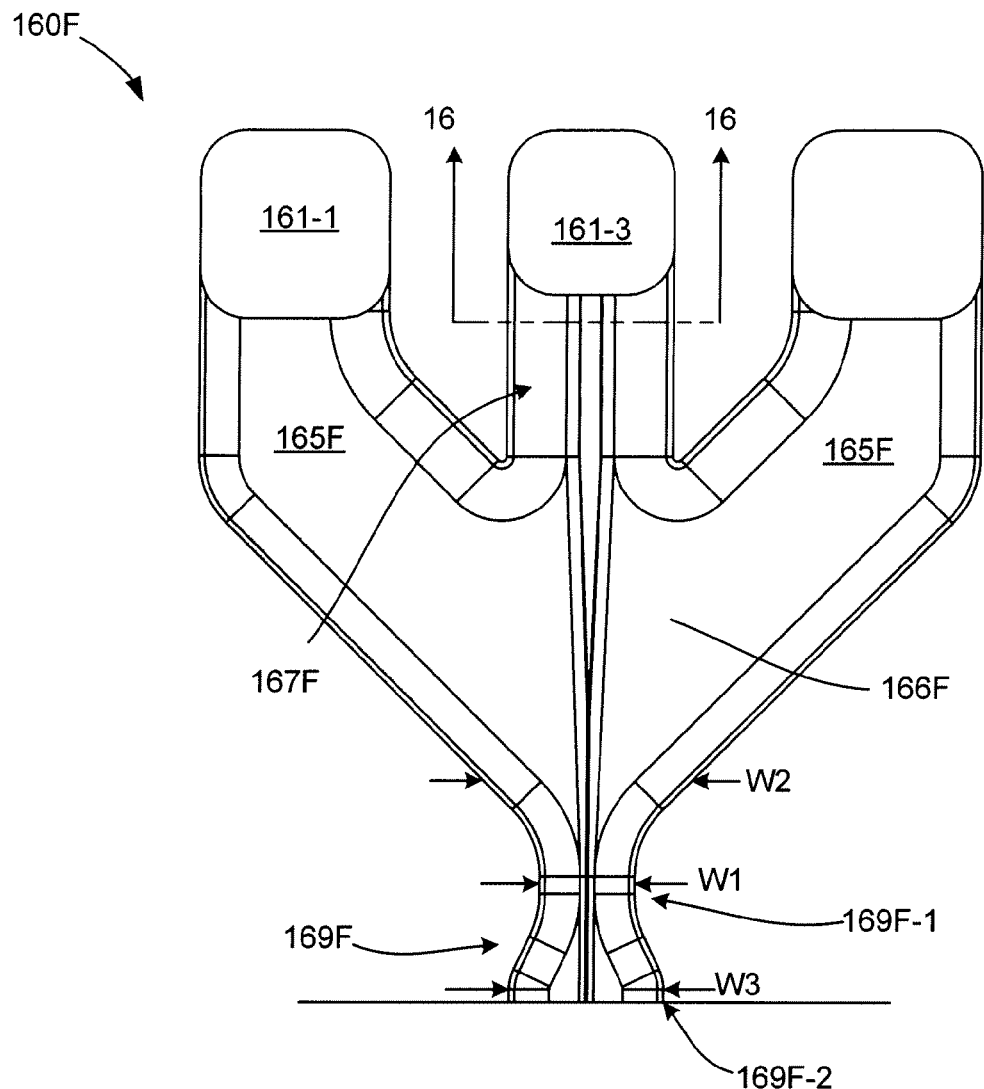
FIG. 15 is a top view the three-part nozzle channel of FIG. 14.
Figure 16:
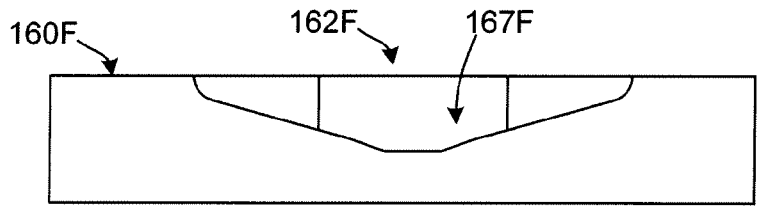
FIG. 16 is a cross-sectional end view taken along section line 16-16 of FIG. 15.

FIGS. 13-16 illustrate a nozzle outlet plate 160F produced in accordance with another embodiment of the present invention. Referring to FIG. 13, nozzle outlet plate 160F is sized and shaped to replace nozzle outlet plate 160E, and includes openings 159-4F and 159-7F that function in the manner described above with reference to openings 159-4E and 159-7E. In addition, nozzle outlet plate 160F is similar to nozzle outlet plate 160E in that nozzle outlet plate 160F includes several three-part nozzle channels 162F that are arranged in a row along a front edge 168F. FIGS. 14, 15 and 16 are enlarged bottom perspective, bottom plan and cross-sectional elevation views showing a portion of nozzle outlet plate 160F including an exemplary three-part nozzle channel 162F of nozzle outlet plate 160F in additional detail. As shown in FIGS. 14 and 15, three-part nozzle channel 162F includes two side channels 165F and a central channel 167F that converge at a merge point 166F in the manner described above, and an outlet orifice 169F defined in a front edge 168F of the plate material forming nozzle outlet plate 160F.

In accordance with an aspect of the present embodiment, nozzle outlet plate 160F differs from nozzle outlet plate 160E in that the three converging channels of each three-part nozzle channel 162F comprise troughs defined (e.g., etched into but not through) the plate material forming nozzle outlet plate 160F. For example, as indicated by the cross-sectional view of central channel 167F that is shown in FIG. 16, each channel of three-part nozzle channel 162F comprises a trough-like cavity having a bottom surface formed by the plate material used to fabricate nozzle outlet plate 160F. Such trough-like cavities are formed, for example, by photochemical machining, electro-discharge machining or by laser ablating metal sheet stock, or by using deep reactive ion etching on a variety of materials, all by known techniques. As such, unlike previous embodiments where the upper wall of each nozzle is defined by a top nozzle plate, each nozzle 163F is defined only by the plate material of nozzle outlet plate 160F that forms each trough, and a bottom nozzle plate (not shown) that is disposed over the open (bottom) surface of each three-part nozzle channel 162F. Referring to FIGS. 14 and 15, openings 161-1 to 161-3 are etched through the plate material of nozzle outlet plate 160F in order to facilitate the flow of gridline and sacrificial material into side channels 165F and central channel 167F from corresponding openings formed in an associated top nozzle plate (not shown).

Referring to FIG. 15, in accordance with another aspect, nozzle outlet plate 160F differs from nozzle outlet plate 160E in that nozzle outlet orifice 169F has a converging/diverging orifice structure in which a relatively narrow section 169-1 having a width W1 is located between the relatively wide merge point 166F (i.e., having a width W2) and a relatively wide open end of outlet orifice 169F, which has a width W3. This converging/diverging arrangement lowers the pressure drop in a printhead incorporating nozzle outlet plate 160F, thereby enabling one or more of higher speed printing and lower pressure operation. Increased print speed is beneficial for the printer productivity, lowered operating pressure is beneficial for increasing printhead reliability and lowering printhead weight and cost.

Techniques for fabricating the various printheads described above are described, for example, in co-owned and co-pending U.S. patent application Ser. No. 11/555,512, entitled "EXTRUSION HEAD WITH PLANARIZED EDGE SURFACE", which is incorporated herein by reference in its entirety. Alternatively, the laminated metal layer arrangements described herein, the extrusion printheads of the present invention can be manufactured by electroplating metal up through features in a patterned resist structure, by brazing together layers of etched plate metal, by generating structures out of photo-definable polymer such as SU8, or by machining or molding.

Figure 17A:
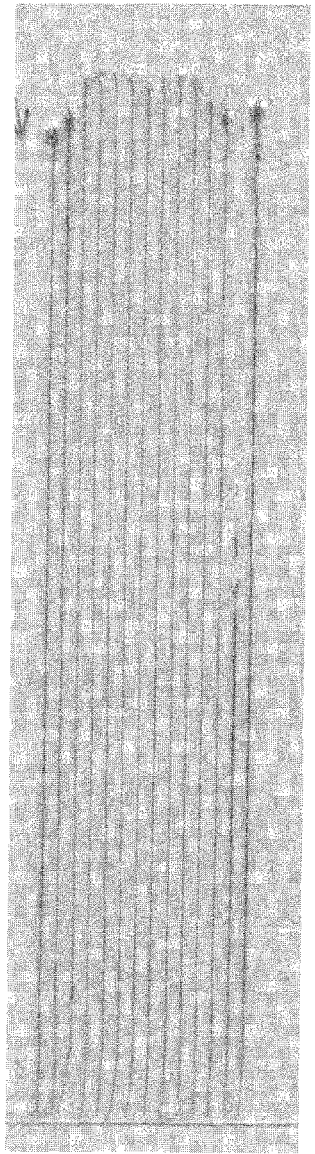
FIGS. 17(A), 17(B), and 17(C) are photographs showing parallel gridlines formed by various printheads produced in accordance with the present invention.
Figure 17B:
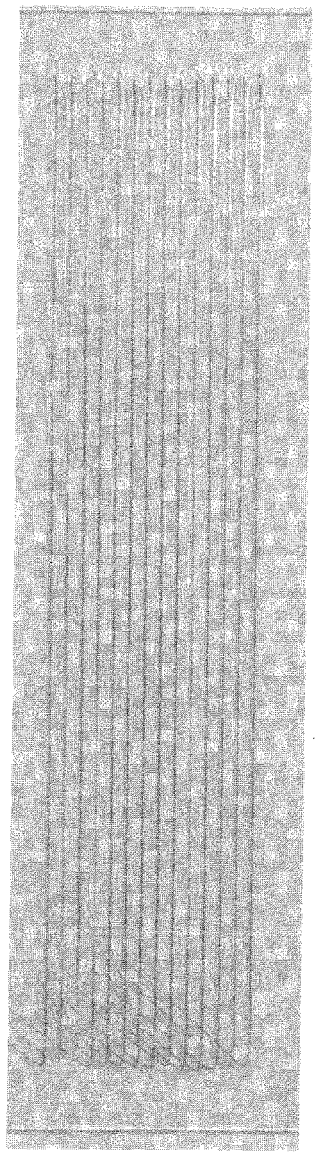
Figure 17C:
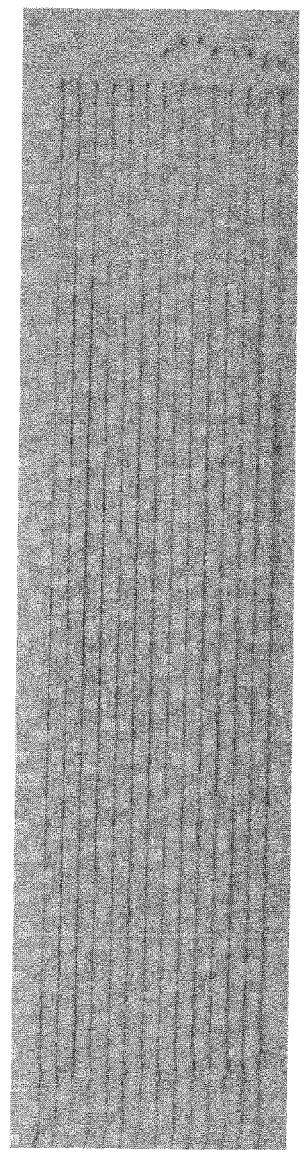

FIGS. 17(A) to 17(C) show comparisons of co-extrusion gridlines that were extruded using printheads formed in accordance with the present invention. FIG. 17(A)) shows gridlines that were generated by a generalized co-extrusion printhead (i.e., wherein none of biasing mechanisms described above with reference to FIGS. 4-7 were utilized). FIG. 17(B) shows gridlines that were generated by a co-extrusion printhead that was modified to extend the top nozzle layer by 30 microns in the manner described above with reference to FIG. 5. FIG. 17(C) shows gridlines that were generated by a co-extrusion printhead that was modified to extend the top nozzle layer by 50 microns in the manner described above with reference to FIG. 5. From these photographs it is noticeable that the print quality is improved by extending the top nozzle layer by 30 microns, and even further improved by extending the top nozzle layer by 50 microns, particularly at the start of the printed line where the lines are more uniform in thickness and the start of the line is more uniform across the fourteen separate nozzles of the printhead. Line defects in FIGS. 17(A) to 17(C) are due to the extruded lines falling over.

Although the present invention has been described with respect to certain specific embodiments, it will be clear to those skilled in the art that the inventive features of the present invention are applicable to other embodiments as well, all of which are intended to fall within the scope of the present invention. For example, a wide variety of dissimilar materials may be used to produce the various layers of printhead assembly 100A (see FIG. 4, described above) while generating the desired bias. In addition, the extensions from the nozzle tip described above with reference to FIGS. 5-7 may take a variety of shapes while accomplishing the desired result. In addition, the extensions from the nozzle tip described above with reference to FIGS. 5-7 may be used in extrusion devices that simultaneously extrude more than two distinct materials e.g. "poly-extrusion." Although machining may prove difficult, data suggest that polytetrafluoroethylene (Teflon) would work very well is place of the polyimide materials disclosed herein, and parylene appears to be a practical coating material. Teflon coatings are also feasible.

The invention claimed is:

1. A layered nozzle structure for extruding a bead of extrusion material from an extrusion printhead assembly onto an upper surface of a target substrate, the layered nozzle structure comprising:
    a top nozzle plate including a first front edge and defining a first inlet port;
    a nozzle outlet plate including a second front edge and defining an elongated nozzle channel extending in a predetermined first flow direction from a closed end to an opening defined through said second front edge; and
    a bottom nozzle plate including a third front edge;
    wherein the bottom nozzle plate and the nozzle outlet plate are beveled such that the second front edge of the nozzle outlet plate and the third front edge of the bottom nozzle plate are coplanar and define a planar orifice edge that is substantially parallel to the upper surface of the target substrate.

2. A micro-extrusion system including a printhead assembly and a material feed system for extruding one or more materials out of extrusion nozzles defined in the printhead assembly such that the extruded materials form parallel beads on an upper surface of a target substrate, wherein the printhead assembly comprises:
    a first plate structure:
    a second plate structure;
    a bottom nozzle plate including a third front edge; and
    a layered nozzle structure sandwiched between the first and second plate structures, wherein the layered nozzle structure includes:
        a top nozzle plate including a first front edge and defining a first inlet port; and
        a nozzle outlet plate including a second front edge and defining an elongated nozzle channel extending in a predetermined first flow direction from a closed end to an opening defined through said second front edge;
    wherein the bottom nozzle plate and the nozzle outlet plate are beveled such that the second front edge of the nozzle outlet plate and the third front edge of the bottom nozzle plate are coplanar and define a planar orifice edge that is parallel to the upper surface of the target substrate.

* * * * *